(12) United States Patent
Noma

(10) Patent No.: US 10,644,720 B2
(45) Date of Patent: May 5, 2020

(54) INFORMATION PROCESSING APPARATUS AND INFORMATION PROCESSING METHOD

(71) Applicant: FUJITSU LIMITED, Kawasaki-shi, Kanagawa (JP)

(72) Inventor: Yui Noma, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/286,157

(22) Filed: Feb. 26, 2019

(65) Prior Publication Data
US 2019/0199372 A1 Jun. 27, 2019

Related U.S. Application Data

(63) Continuation of application No. PCT/JP2017/046673, filed on Dec. 26, 2017.

(30) Foreign Application Priority Data

Jan. 11, 2017 (JP) ................ 2017-002818

(51) Int. Cl.
| | | |
|---|---|---|
| *H03M 7/42* | (2006.01) | |
| *H03M 7/40* | (2006.01) | |
| *H03M 7/30* | (2006.01) | |
| *G06T 9/00* | (2006.01) | |

(52) U.S. Cl.
CPC ............ *H03M 7/42* (2013.01); *G06T 9/007* (2013.01); *H03M 7/30* (2013.01); *H03M 7/3062* (2013.01); *H03M 7/3066* (2013.01); *H03M 7/40* (2013.01)

(58) Field of Classification Search
None
See application file for complete search history.

(56) References Cited

U.S. PATENT DOCUMENTS

| | | | |
|---|---|---|---|
| 2002/0039449 A1* | 4/2002 | Nouda | .......... G06T 9/004 382/238 |
| 2005/0069364 A1 | 3/2005 | Mokuya et al. | |
| 2010/0166329 A1* | 7/2010 | Nakayama | ......... G06F 17/145 382/244 |
| 2015/0120683 A1* | 4/2015 | Okuyama | ......... G06F 16/1744 707/693 |

FOREIGN PATENT DOCUMENTS

| | | |
|---|---|---|
| JP | 2001-309185 | 11/2001 |
| JP | 2003-230139 | 8/2003 |
| JP | 2006-24227 | 1/2006 |
| JP | 2010-154328 | 7/2010 |

(Continued)

OTHER PUBLICATIONS

David Salomon, "Data Compression", Springer, pp. 978-1007, 2007.

(Continued)

*Primary Examiner* — Howard Williams
(74) *Attorney, Agent, or Firm* — Staas & Halsey LLP

(57) ABSTRACT

An information processing apparatus includes a memory and a processor coupled to the memory. The processor receives a compression request which designates data represented by a plurality of integers, and reduces entropy by multiplying a data matrix, which is obtained by representing the data designated by the compression request by a matrix, by a transformation matrix of which determinant is 1.

10 Claims, 25 Drawing Sheets

(56) References Cited

FOREIGN PATENT DOCUMENTS

JP    2010-226532    10/2010
JP    2015-88844     5/2015

OTHER PUBLICATIONS

Jean-Pierre Serre, "A Course in Arithmetic (Graduate Texts in Mathematics)", Springer-Verlag New York, pp. 77-79, 1973.
International Search Report dated Mar. 20, 2018 in corresponding International Patent Application No. PCT/JP2017/046673.
Written Opinion of the International Searching Authority dated Mar. 20, 2018 in corresponding International Patent Application No. PCT/JP2017/046673.

* cited by examiner

FIG. 3

| SYMBOL VECTOR | NUMBER OF APPEARANCES |
|---|---|
| (0,0) | 50 |
| (0,128) | 20 |
| (128,0) | 10 |
| (128,128) | 30 |

FIG. 4

| 1-BYTE SYMBOL | NUMBER OF APPEARANCES |
|---|---|
| 0 | 130 |
| 128 | 90 |

FIG. 7

| SYMBOL VECTOR | NUMBER OF APPEARANCES |
|---|---|
| (0,0) | 50 |
| (0,128) | 30 |
| (128,0) | 20 |
| (128,128) | 10 |

FIG. 8

| 1-BYTE SYMBOL | NUMBER OF APPEARANCES |
|---|---|
| 0 | 150 |
| 128 | 70 |

INFORMATION PROCESSING APPARATUS AND INFORMATION PROCESSING METHOD

CROSS-REFERENCE TO RELATED APPLICATION

This application is a continuation application of International Application PCT/JP2017/046673 filed on Dec. 26, 2017 and designated the U.S., the entire contents of which are incorporated herein by reference. The International Application PCT/JP2017/046673 is based upon and claims the benefit of priority of the prior Japanese Patent Application No. 2017-002818, filed on Jan. 11, 2017, the entire contents of which are incorporated herein by reference.

FIELD

The embodiments discussed herein are related to an information processing apparatus and an information processing method.

BACKGROUND

It is requested to acquire data from each of monitoring cameras, microphones, and sensors connected via the Internet, to analyze or collate the acquired data, and to use the analyzed data or the collated data in business. For that purpose, it is desirable to acquire data and to store the acquired data in an available format.

On the other hand, in a case where data is acquired from all the sensors and an amount of data is enormously increased, there are cases where a large amount of data is stored in a recordable device such as a tape device. However, these devices are slow in reading speed and are not suitable for use.

It is preferable to compress a large amount of data and to store the compressed data in a hard disk or the like. For this reason, data compression techniques become important. In addition, since network traffic is increased, it is also important to reduce an amount of traffic by compressing data and transmitting the compressed data by a sensor device.

From such a viewpoint, a technique of performing lossless compression of multi-valued image data after rearranging bit strings such that a probability that the same bits sequentially appear becomes high, a technique of calculating a multi-stage transformation function based on components obtained by an inputted digital image signal and determining coefficients of the function so as to satisfy reversibility and to reduce output entropy, and the like are known.

Related techniques are disclosed in the following documents: Japanese Laid-open Patent Publication No. 2001-309185; Japanese Laid-open Patent Publication No. 2003-230139; David Salomon, "*Data Compression*", ISBN: 978-0-387-40697-8; and Jean-Pierre Serre, "*A Course in Arithmetic* (*Graduate Texts in Mathematics*)", Springer-Verlag New York, 1973.

SUMMARY

According to an aspect of the embodiments, an information processing apparatus includes a memory and a processor coupled to the memory. The processor receives a compression request which designates data represented by a plurality of integers, and reduces entropy by multiplying a data matrix, which is obtained by representing the data designated by the compression request by a matrix, by a transformation matrix of which determinant is 1.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 3 is a diagram illustrating a result example of appearance frequencies of 2-byte pairs;

FIG. 4 is a diagram illustrating a result example of appearance frequencies of 1-byte symbols based on the result example of FIG. 3;

FIG. 7 is a diagram illustrating a result example of appearance frequencies of 2-byte pairs after transformation;

FIG. 8 is a diagram illustrating a result example of appearance frequencies of 1-byte symbols after transformation based on the result example of FIG. 7;

FIG. 20 is a diagram illustrating an example of a symbol-to-numerical-value conversion table;

FIG. 22 is a diagram illustrating an improvement example of the symbol-to-numerical-value conversion table of FIG. 20;

DESCRIPTION OF EMBODIMENTS

Figure 1:
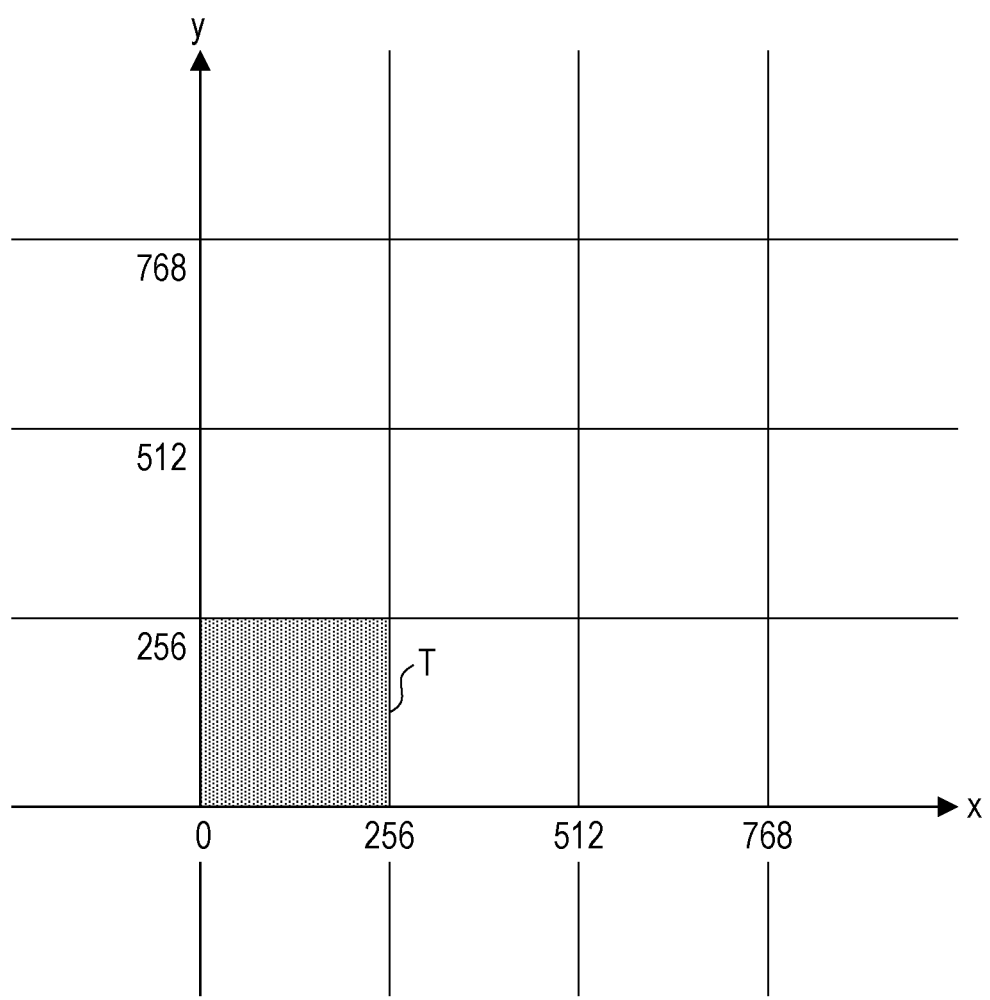
FIG. 1 is a diagram illustrating an example of a torus.

Lossless compression techniques are mainly divided into LZ-based dictionary compression, run-length compression, and entropy coding. Any of these lossless compression techniques is not able to reduce entropy.

Even in the technique using the above-described multi-stage transform function, there is no disclosure on a method of determining the coefficient of the multi-stage transform function, and it is difficult to sufficiently solve the problem of reducing entropy.

Hereinafter, embodiments discussed herein will be described with reference to the drawings. Lossless compression techniques are mainly divided into LZ-based dictionary compression, run-length compression, and entropy coding. First, these lossless compression techniques will be briefly described.

The dictionary compression is a technique of regarding a file as byte strings, reading the byte strings from the head, and when the same partial byte string appears, replacing the partial byte string with a code indicating a pointer of a previously-appeared byte string from the head position and indicating the number of matching characters.

The run-length compression is a technique of, when the same byte character runs, replacing the same byte character with a code indicating the running byte character and a run-length.

The entropy coding is a technique that is known as, for example, Huffman coding or the like and reduces an amount of data by transforming a character appearing many times into a short bit string based on entropy calculated from appearance frequencies of byte characters.

From the viewpoint of reducing the amount of data, the entropy coding focuses on a fact that, in data such as an image, a sound, or sensor data which has strong correlation between numerical values of acquired signals, adjacent numerical values are similar. Most information of an original signal may be represented by a small number of numerical values by setting numerical value strings of the signal to points in a high-dimensional space and performing appropriate coordinate transformation. In a case of an image, discrete cosine transform, wavelet transform, or the like may be used. In a case where numerical value calculation may be performed in a high dimension, by representing a signal with a small number of numerical values, it is possible to increase the number of numerical values that become 0 or to increase the number of the same numerical values, and thus it is possible to perform highly-efficient lossless compression.

Such numerical value calculation may be divided into floating point calculation and integer calculation. The floating point calculation is loss calculation because there is a rounding of the decimal point. Although the integer calculation may be performed in a lossless manner, a value range of numerical values may extend beyond a defined range; for example, a difference between numerical values from 0 to 255 falls within a range of −255 to +255.

As an example, a sum of 1-byte data and 1-byte data or a difference between 1-byte data and 1-byte data is represented by 2 bytes. In a case of representing the sum or the difference, a longer byte may be used, and this leads to an increase in the amount of data during calculation processing.

In the above-described lossless compression technique, it is not possible to sufficiently reduce entropy, and the numerical value calculation has the following problem.

When floating point calculation is performed by converting integer value data to a floating point number, lossless calculation may not be performed due to a rounding error.

In a case where integer value calculation of integer value data is performed, it is not possible to perform lossless calculation unless a value range of numerical values is allowed to be extended; for example, a difference between numerical values from 0 to 255 falls within a range of −255 to +255.

First, in a first embodiment, by considering a byte string as a point in a high-dimensional torus, it is possible to suppress an extension of a range of numerical values, and to perform lossless calculation within a range of integer calculation. Considering a number line, by regarding 0 and 256 as the same, the sum and the difference may exist inside the same circle. Therefore, results of the sum of 1-byte data and 1-byte data and the difference between 1-byte data and 1-byte data may be represented by 1 byte.

In addition, by pairing N bytes, it is possible to perform matrix calculation of torus-to-torus transform, and thus it is possible to reduce entropy. For example, by making it possible to perform matrix calculation of torus-to-torus transform, appearance frequencies of 1-byte data may be biased without increasing the amount of data, and as a result, entropy is reduced.

Known techniques may be used to compress and decompress entropy-reduced data. By performing a reverse procedure to the entropy reducing procedure, which is performed before compression, on the decompressed data, original data may be restored.

The first embodiment is realized by the following parts: 1. Suppression of Extension of Byte by Torus; 2. Changing of Symbol Appearance Frequencies by Matrix Calculation of Torus-to-Torus Transform; 3. Searching Method of Transformation Matrix for Entropy Reducing; 4. Storage Format of Entropy-reduced Data; 5. Compression of Data; 6. Decompression of Data; and 7. Restoring of Original Data. Each of the parts 1 to 7 will be described. Hereinafter, a case where 256 is taken as an example and 0 and 256 are regarded as the same will be described. On the other hand, an integer multiple of 1 byte, such as 512 or 768, may be taken as a range of acquirable numerical values. An integer smaller than 1 byte, such as 127, may be taken as a range of acquirable numeric values.

1. Suppression of Extension of Byte by Torus

Figure 12:
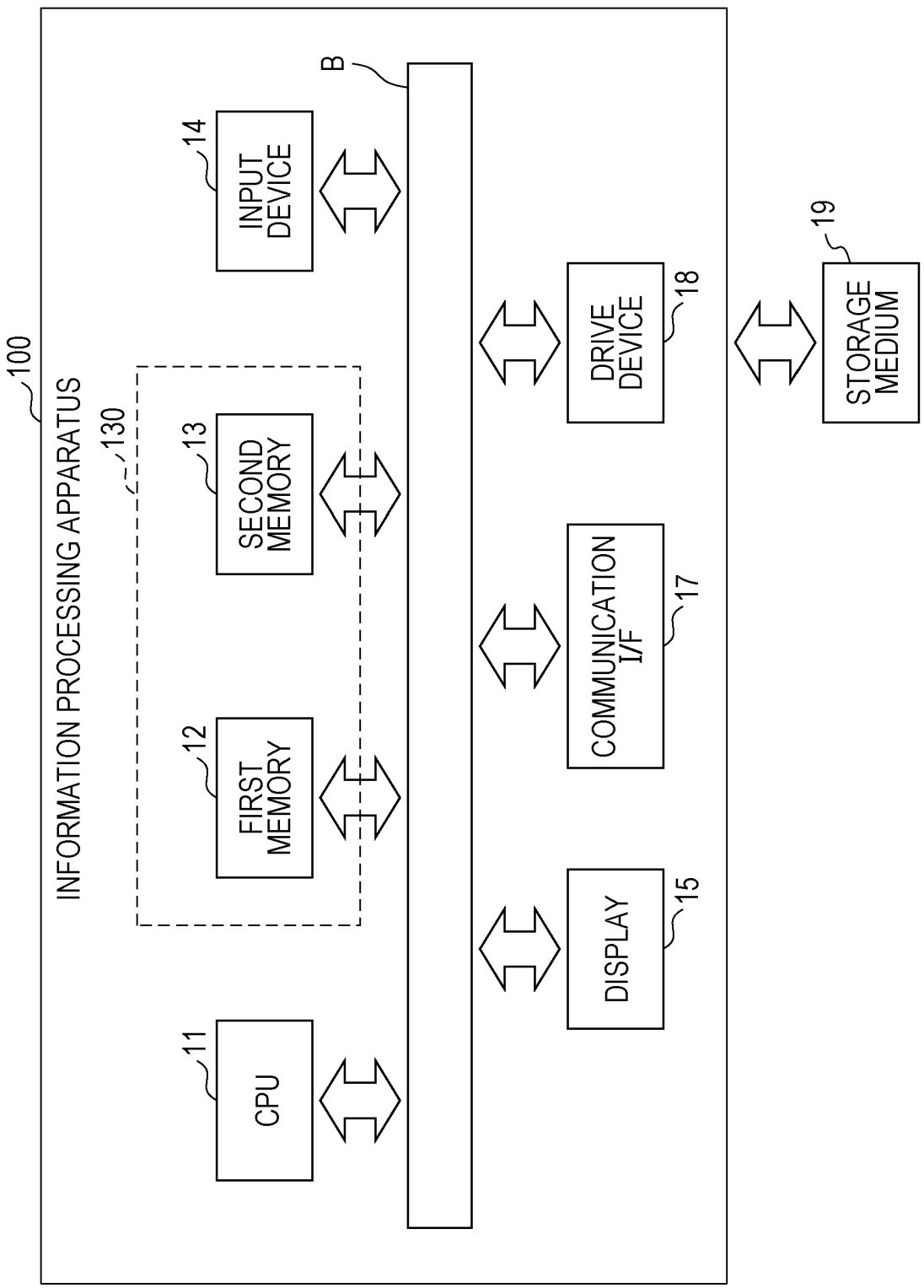
FIG. 12 is a hardware configuration diagram of an information processing apparatus.

All data is stored as byte strings in a memory 130 of an information processing apparatus 100 (FIG. 12). Assuming that the byte strings are 1-byte strings, a 1-byte character is represented by a numerical value from 1 to 255.

Considering a number line, by regarding 0 and 256 as the same, a circle is prepared. This processing is performed in the information processing apparatus 100 by taking a remainder of an integer p by 256. Hereafter, taking a remainder of an integer p by 256 is represented by "p%256". % indicates modulo. In a case of p=500, since 500%256=244, a numerical value 500 is represented by 244. When expressing this calculation in hexadecimal, 0x01F4 is converted to 0xF4.

This is represented by Equation 1.

$$p \sim q \Leftrightarrow p = q + 256 * k \qquad \text{[Equation 1]}$$

Here, ~ indicates an equivalence relationship, and p and q indicate integers. When Equation 1 is defined to be established by an integer k, Equation 2 is established.

$$S = \mathbb{Z}/\sim \qquad \text{[Equation 2]}$$

Here, S indicates a circle.

On this circle S, 1-byte characters are naturally expressed as numerical values from 0 to 255.

When two numerical values are on this circle S, a sum of the two numerical values and a difference between the two numerical values are on the same circle. For example, a sum of 40 and 244 is (40+244)%256=28, and a difference between 40 and 244 is (40−244)%256=52. A result of multiplying a numerical value on the circle by an integer value is also on the same circle. For example, a product of a 1-byte character 40 and an integer "8" is (8*40)%256=64. * indicates multiplication.

Assuming that an N-byte character is set to N-length 1-byte character strings, each component may be processed as a numerical value on a circle, and calculation of a sum and a difference may be performed within a range of 0 to 255. For example, a sum of a 1-byte character string (100, 200, 250) and a 1-byte character string (150, 250, 50) is (100+150, 200+250, 250+50)%256=(250, 194, 44). Such a circle matrix S×S× . . . ×S is a geometric structure referred to as an N-dimensional torus T. A result of multiplying a 1-byte character string by an integer value is on the torus T. For example, a result of multiplying a 1-byte character string (100, 200, 250) by an integer "3" is (3*100, 3*200, 3*250) %256=(44, 88, 238).

The N-dimensional torus T, which is configured with N-length 1-byte character strings, includes each component corresponding to a numerical value from 0 to 255, and may be represented by N 1-byte components. For example, when regarding N bytes as the N-dimensional torus T, a sum and a product of the N bytes, and even integer multiples of the N bytes may be represented by N bytes. This is called as embedding of a byte string into a torus.

Thereby, a result obtained by multiplying N bytes by a numerical value may be within a range of N bytes. Thus, an increase in an amount of data due to an extension of a range of numerical values obtained by calculation in related art may not be considered. This is one of effects according to the first embodiment.

FIG. 1 is a diagram illustrating an example of a torus. In FIG. 1, a two-dimensional torus T when N is 2 is illustrated. FIG. 1 as a whole illustrates a two-dimensional space, which is represented by Equation 3.

$$\mathbb{Z} \times \mathbb{Z} \qquad \text{[Equation 3]}$$

The torus T is represented by a rectangular area surrounded by vertical and horizontal lines passing through a point (0, 0) and vertical and horizontal lines passing through a point (256, 256). Each of vertical lines passing through a point (0,256), a point (0,512), and a point (0,768) and each of horizontal lines passing through a point (256,0), a point (512,0) and a point (768,0) are regarded as the vertical and horizontal lines passing through a point (0, 0).

An acquirable maximum value in the torus T may be a numerical value other than "256". For example, in a case where target data is text data, ASCII codes from 0 to 127 are written in the torus, and a maximum value may be a number "128" smaller than 256. In addition, when considering a character with a length of 2 bytes or more, a maximum value may be a number larger than 256, for example, "512". The maximum value may be a prime number.

In cryptography theories, it is widely practiced to perform calculation by a numerical value obtained by taking a remainder of an integer by a prime number, and this calculation is lossless calculation. On the other hand, in order to represent a 1-byte symbol, the smallest prime number larger than 256 is "267", and 9 bits or more may be used. For example, in calculators currently widely used, it is more efficient to express 9 bits by 2 bytes. When 9 bits are expressed by 2 bytes, a size of data becomes larger. Therefore, in the following explanation, it is assumed that an acquirable maximum value in the torus T is "256".

Figure 2A:
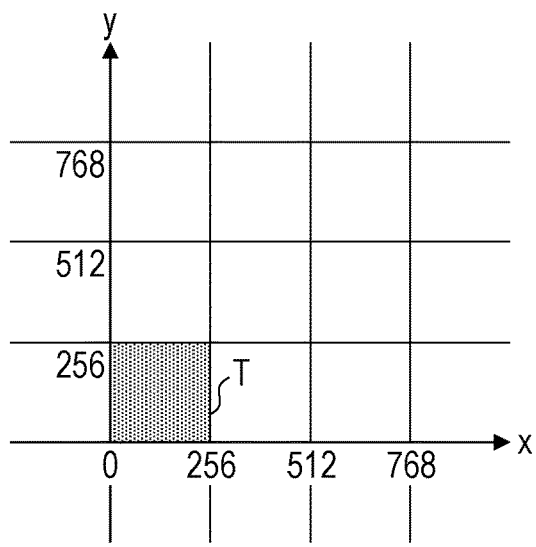
FIGS. 2A, 2B and 2C are diagrams for explaining a changing method of symbol appearance frequencies (entropy)
Figure 2B:
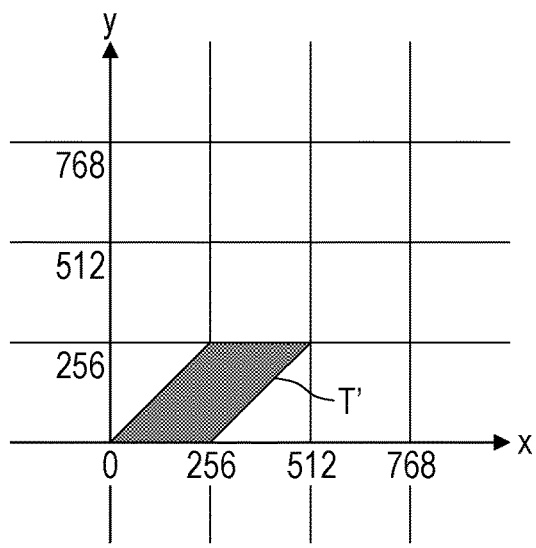
Figure 2C:
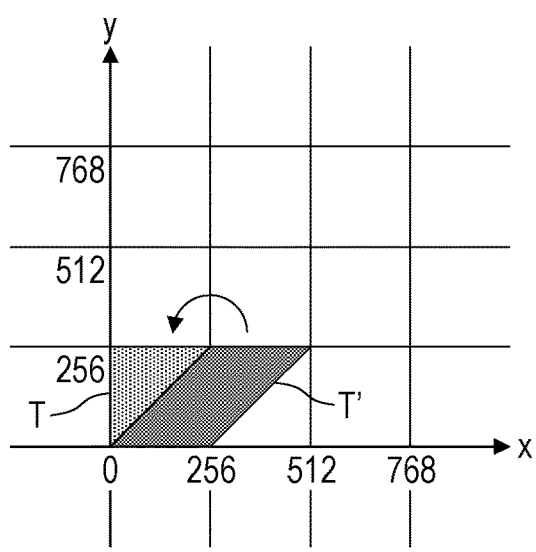

2. Changing of Symbol Appearance Frequencies by Matrix Calculation of Torus-to-Torus Transform In the first embodiment, a changing method of appearance frequencies (entropy) of the same 1-byte symbols by torus-to-torus transform will be described with reference to FIGS. 2A, 2B and 2C. FIGS. 2A, 2B and 2C are diagrams for explaining a changing method of symbol appearance frequencies (entropy).

First, N 1-byte character strings are vertically arranged. This is represented by Equation 4.

$$v = \begin{pmatrix} v_1 \\ v_2 \\ \vdots \\ v_N \end{pmatrix} \qquad \text{[Equation 4]}$$

A matrix in which all components are integers is referred to as an integer coefficient matrix. It is assumed that an N-by-N integer coefficient matrix A is represented by Equation 5.

$$A = \begin{pmatrix} a_{11} & \cdots & a_{1N} \\ \vdots & \ddots & \vdots \\ a_{N1} & \cdots & a_{NN} \end{pmatrix}, \qquad \text{[Equation 5]}$$

$$a_{11}, a_{12}, \ldots, a_{NN} \in \mathbb{Z}$$

Hereinafter, the N-by-N integer coefficient matrix A may be simply referred to as a transformation matrix A.

A result of multiplying the 1-byte character strings v by the transformation matrix A is represented by Equation 6.

$$A \cdot v = \begin{pmatrix} \sum_{j=1}^{N} a_{1j} v_j \\ \sum_{j=1}^{N} a_{2j} v_j \\ \vdots \\ \sum_{j=1}^{N} a_{Nj} v_j \end{pmatrix} \qquad \text{[Equation 6]}$$

Although the result of the multiplication of the transformation matrix A exceeds the range from 0 to 255, by taking a remainder of the result by 256, the result may return to N bytes. This is represented by Equation 7.

$$A \cdot v \% 256 \qquad \text{[Equation 7]}$$

In Equation 7, calculation of the multiplication of the transformation matrix A and calculation of the remainder of the multiplication result by 256 may be executed by a computer.

As an example, it is assumed that N is 2 and the transformation matrix A is represented by Equation 8.

$$A = \begin{pmatrix} 1 & 1 \\ 0 & 1 \end{pmatrix} \qquad \text{[Equation 8]}$$

In this case, a torus T of FIG. 2A is transformed into a torus T' of FIG. 2B by multiplying the transformation matrix A. As represented in Equation 7, by taking a remainder of the multiplication result of the transformation matrix A by 256, the torus T' returns to an area of the original torus T as illustrated in FIG. 2C.

When a determinant of the transformation matrix A is 1, an inverse transformation matrix $A^{-1}$ is also an integer coefficient matrix.

It is assumed that the inverse transformation matrix $A^{-1}$ is represented by Equation 9.

$$A^{-1} = \begin{pmatrix} (a^{-1})_{11} & \cdots & (a^{-1})_{1N} \\ \vdots & \ddots & \vdots \\ (a^{-1})_{N1} & \cdots & (a^{-1})_{NN} \end{pmatrix}, \qquad \text{[Equation 9]}$$

$$(a^{-1})_{11}, (a^{-1})_{12}, \ldots, (a^{-1})_{NN} \in \mathbb{Z}$$

In this case, Equation 10 is satisfied.

$$A^{-1} \cdot A = A \cdot A^{-1} = \begin{pmatrix} 1 & 0 & \cdots & 0 \\ 0 & 1 & \cdots & 0 \\ \vdots & \vdots & \ddots & \vdots \\ 0 & 0 & \cdots & 1 \end{pmatrix} \qquad \text{[Equation 10]}$$

That is, a product of the transformation matrix A and the inverse transformation matrix $A^{-1}$ satisfies a commutative law, and becomes a unit matrix.

By applying the inverse transformation matrix $A^{-1}$ to Equation 7, the following Equation 11 is obtained.

$$A^{-1} \cdot (A \cdot v \% 256) \% 256 = v \qquad \text{[Equation 11]}$$

By multiplying the transformation matrix A which is an integer coefficient matrix and of which the determinant is 1, it is possible to perform lossless calculation from N bytes to N bytes.

A fact that it is possible to reduce entropy by biasing appearance frequencies of 1-byte symbols using the lossless calculation will be described. As a simple example, a case where N is 2 is considered. An example where only 0 and 128 appear as data is considered. In a case where data is 0, 0, 128, 0, 128, 128, 0, 128, . . . , symbols are paired for every 2 bytes from the beginning.

Each pair for every 2 bytes, for example, (0, 0), (128, 0), (128, 128), (0, 128), . . . corresponds to any one of four pairs of (0, 0), (0, 128), (128, 0), (128, 128). It is assumed that appearance frequencies of each of the 2-byte pairs are examined and a result as illustrated in FIG. 3 is obtained.

FIG. 3 is a diagram illustrating a result example of appearance frequencies of 2-byte pairs. In the result 71 of FIG. 3, the appearance frequency for each pair indicates the number of appearances of each of 2-byte pairs. In FIG. 3, a symbol vector indicates a 2-byte pair. The number of appearances indicates the number of times each pair appears in the data.

In the result 71 of the appearance frequencies in FIG. 3, the number of appearances of a pair (0, 0) is "50", the number of appearances of a pair (0, 128) is "20", the number of appearances of a pair (128, 0) is "10", and the number of appearances of a pair (128, 128) is "30". Based on the result 71 of the appearance frequencies, it is possible to obtain the appearance frequencies of 1-byte symbols.

FIG. 4 is a diagram illustrating a result example of appearance frequencies of 1-byte symbols based on the result example of FIG. 3. In the result 73 of FIG. 4, the appearance frequency of a 1-byte symbol indicates the number of appearances of each of 1-byte symbols. In FIG. 4, the 1-byte symbols indicate only "0" and "128". The number of appearances indicates the number of times each 1-byte symbol appears in the data.

In the result 73 of the appearance frequencies of FIG. 4, the number of appearances of a 1-byte symbol "0" is "130", and the number of appearances of a 1-byte symbol "128" is "90".

Figure 5:
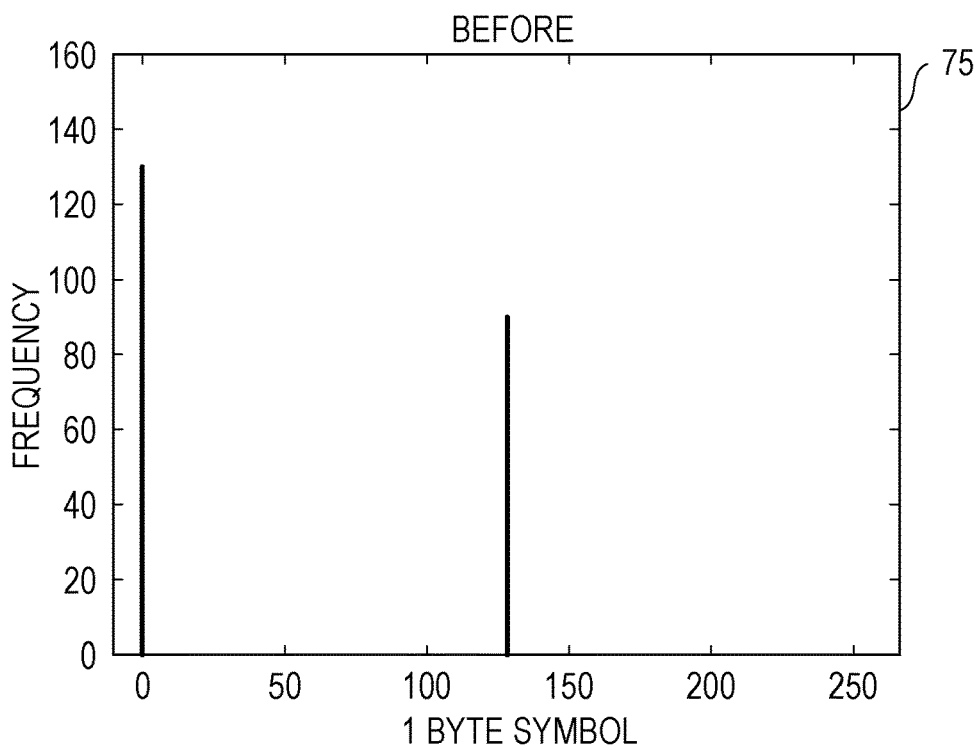
FIG. 5 is a diagram illustrating a histogram of 1-byte symbols based on the result example of FIG. 4.

A histogram before the symbol appearance frequencies are changed according to the first embodiment will be described. FIG. 5 is a diagram illustrating a histogram of the 1-byte symbols based on the result example of FIG. 4. In the histogram 75 of FIG. 5, the 1-byte symbols are illustrated on a horizontal axis, and the appearance frequencies of the 1-byte symbols are illustrated on a vertical axis.

The histogram 75 illustrates the number of appearances of each of 1-byte symbols from 0 to 255 in terms of frequency based on the result 73 of the appearance frequencies of FIG. 4. Since 1-byte symbols are only "0" and "128", the histogram 75 illustrates the 1-byte symbol "0" with a frequency "130" and the 1-byte symbol "128" with a frequency "90".

Figure 6:
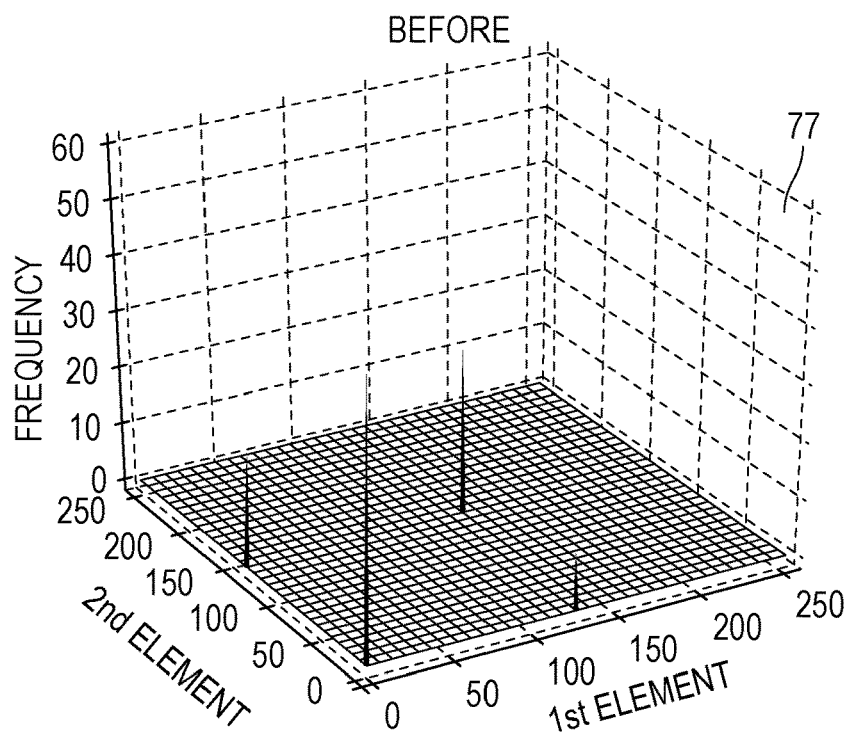
FIG. 6 is a diagram illustrating a two-dimensional histogram of 1-byte symbols based on the result example of FIG. 3.

FIG. 6 is a diagram illustrating a two-dimensional histogram of the 1-byte symbols based on the result example of FIG. 3. In the two-dimensional histogram 77 of FIG. 6, a first value of a 2-byte pair is illustrated on a first element axis, the next value of the 2-byte pair is illustrated on a second element axis, and appearance frequencies of pairs are illustrated on a vertical axis.

The histogram 77 illustrates the number of appearances of each of four 2-byte pairs in terms of frequency based on the result 71 of the appearance frequencies of FIG. 3. Thus, the histogram 75 illustrates a pair (0, 0) with a frequency "50", a pair (0, 128) with a frequency "20", a pair (128, 0) with a frequency "10", and a pair (128, 128) with a frequency "30".

In the first embodiment, it is possible to reduce entropy by transforming such 2-byte pairs using the transformation matrix A represented in Expression 8 and biasing the appearance frequencies of the 2-byte pairs. Each 2-byte pair is transformed as represented in Equation 12.

$$A \cdot \begin{pmatrix} 0 \\ 0 \end{pmatrix} \% 256 = \begin{pmatrix} 0 \\ 0 \end{pmatrix} \qquad \text{[Equation 12]}$$

-continued $$A \cdot \begin{pmatrix} 128 \\ 0 \end{pmatrix} \% \ 256 = \begin{pmatrix} 128 \\ 0 \end{pmatrix}$$

$$A \cdot \begin{pmatrix} 0 \\ 128 \end{pmatrix} \% \ 256 = \begin{pmatrix} 128 \\ 128 \end{pmatrix}$$

$$A \cdot \begin{pmatrix} 128 \\ 128 \end{pmatrix} \% \ 256 = \begin{pmatrix} 0 \\ 128 \end{pmatrix}$$

By the transformation of Equation 12, the appearance frequencies of the 2-byte pairs are changed.

FIG. 7 is a diagram illustrating a result example of the appearance frequencies of the 2-byte pairs after transformation. In the result 81 of FIG. 7, the appearance frequency for each pair indicates the number of appearances of each of the 2-byte pairs. The number of appearances of a symbol vector has the same meaning as described in FIG. 3.

In the result 81 of the appearance frequencies in FIG. 7, the number of appearances of a pair (0, 0) is "50", the number of appearances of a pair (0, 128) is "30", the number of appearances of a pair (128, 0) is "20", and the number of appearances of a pair (128, 128) is "10". The result 81 of the appearance frequencies is different from the result 71 of the appearance frequencies before the transformation illustrated in FIG. 3.

FIG. 8 is a diagram illustrating a result example of appearance frequencies of 1-byte symbols after transformation based on the result example of FIG. 7. In the result 83 of FIG. 8, the appearance frequency of a 1-byte symbol indicates the number of appearances of each of 1-byte symbols. In FIG. 8, the 1-byte symbols indicate only "0" and "128".

The number of appearances indicates the number of times each 1-byte symbol appears in the data.

In the result 83 of the appearance frequencies of FIG. 8, the number of appearances of a 1-byte symbol "0" is "150", and the number of appearances of a 1-byte symbol "128" is "70". The result 83 of the appearance frequencies is different from the result 73 of the appearance frequencies before the transformation illustrated in FIG. 4.

Figure 9:
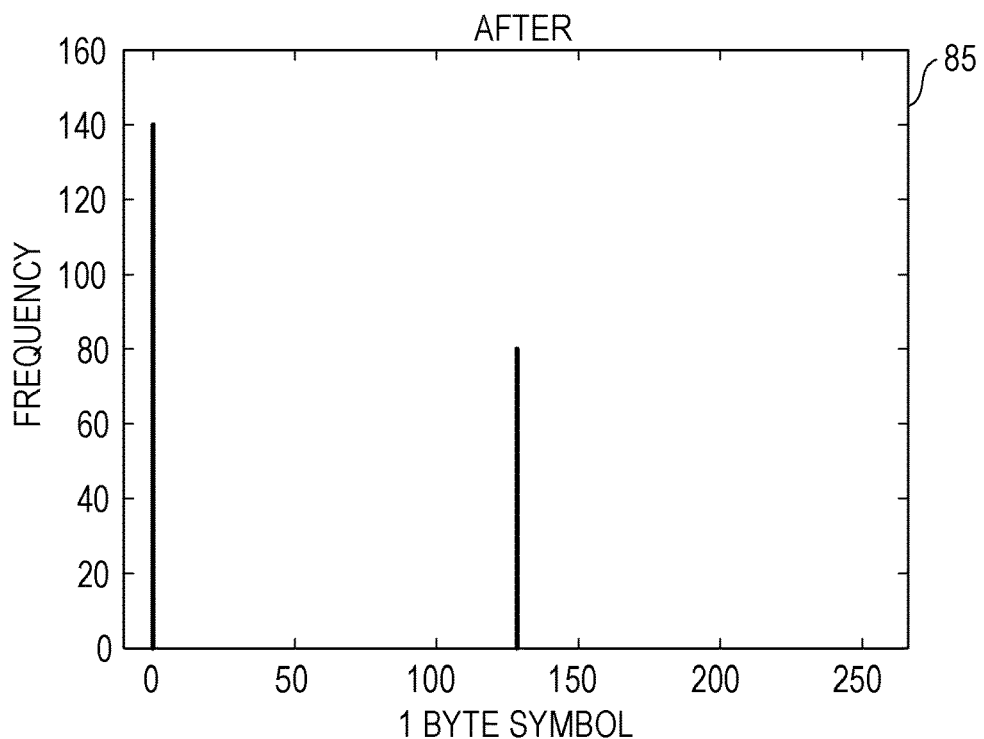
FIG. 9 is a diagram illustrating a histogram of 1-byte symbols after changing of symbol appearance frequencies based on the result example of FIG. 8.

A histogram after changing of the symbol appearance frequencies according to the first embodiment will be described. FIG. 9 is a diagram illustrating a histogram of the 1-byte symbols after changing of the symbol appearance frequencies based on the result example of FIG. 8. In the histogram 85 of FIG. 9, the 1-byte symbols are illustrated on a horizontal axis, and the appearance frequencies of the 1-byte symbols are illustrated on a vertical axis.

The histogram 85 illustrates the number of appearances of each of 1-byte symbols from 0 to 255 in terms of frequency based on the result 83 of the appearance frequencies of FIG. 8. Since 1-byte symbols are only "0" and "128", the histogram 85 illustrates the 1-byte symbol "0" with a frequency "150" and the 1-byte symbol "128" with a frequency "70".

Compared with the histogram 75 of FIG. 5, in the histogram 85, the appearance frequency of the 1-byte symbol "0" is increased, and the appearance frequency of the 1-byte symbol "128" is decreased.

This illustrates a state where the appearance frequencies are biased toward the 1-byte symbol "0".

Figure 10:
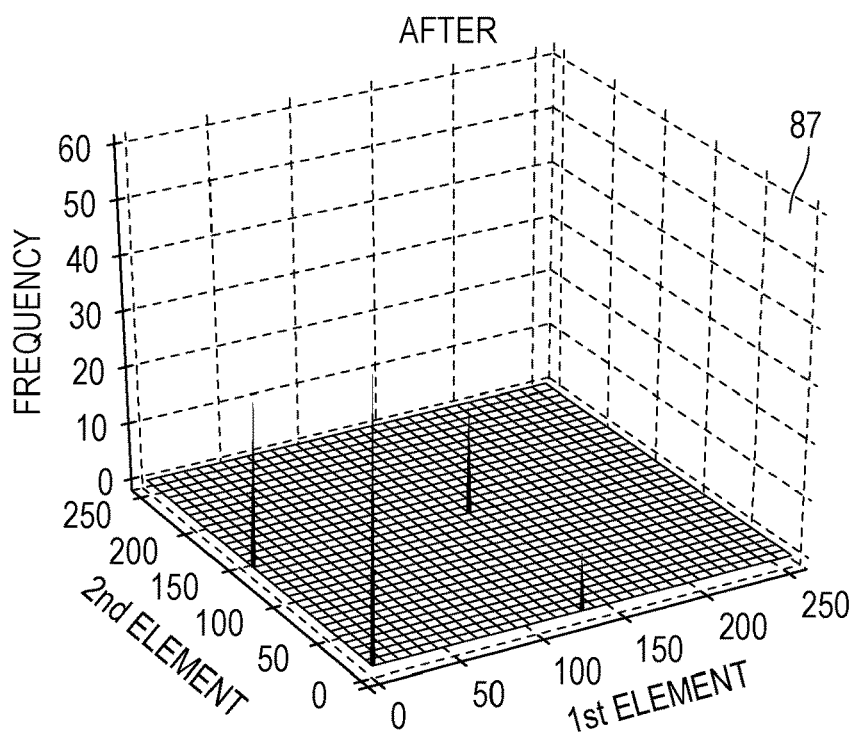
FIG. 10 is a diagram illustrating a two-dimensional histogram of 1-byte symbols after changing of symbol appearance frequencies based on the result example of FIG. 7.

FIG. 10 is a diagram illustrating a two-dimensional histogram of the 1-byte symbols after changing of the symbol appearance frequencies based on the result example of FIG. 7. In the two-dimensional histogram 87 of FIG. 10, a first value of a 2-byte pair is illustrated on a first element axis, the next value of the 2-byte pair is illustrated on a second element axis, and appearance frequencies of pairs are illustrated on a vertical axis.

The histogram 87 illustrates the number of appearances of each of four 2-byte pairs in terms of frequency based on the result 81 of the appearance frequencies of FIG. 7. Thus, the histogram 85 illustrates a pair (0, 0) with a frequency "50", a pair (0, 128) with a frequency "30", a pair (128, 0) with a frequency "20", and a pair (128, 128) with a frequency "10".

Next, entropy of the 1-byte symbols will be described. Entropy is defined by Equation 13.

$$\text{entropy} = -\sum_i p_i \times \log_2(p_i) \quad \text{[Equation 13]}$$

In Equation 13, $p_i$ indicates a value obtained by dividing the number of appearances of a symbol "i" by the total number of symbols, and represents an appearance probability of each symbol. The entropy before the appearance frequencies are changed is represented by Equation 14.

$$\text{entropy}_{before} = -\frac{130}{220}\log_2\left(\frac{130}{220}\right) - \frac{90}{220}\log_2\left(\frac{90}{220}\right) = 0.97602 \quad \text{[Equation 14]}$$

On the other hand, the entropy after changing of the appearance frequencies is represented by Equation 15.

$$\text{entropy}_{after} = -\frac{150}{220}\log_2\left(\frac{150}{220}\right) - \frac{70}{220}\log_2\left(\frac{70}{220}\right) = 0.90239 \quad \text{[Equation 15]}$$

The entropy after changing of the appearance frequencies is lower than the entropy before changing of the appearance frequencies.

The transformation matrix A is an invertible matrix, and an inverse matrix of the transformation matrix A is given by Equation 16.

$$A^{-1} = \begin{pmatrix} 1 & -1 \\ 0 & 1 \end{pmatrix} \quad \text{[Equation 16]}$$

This inverse matrix may be obtained by a computer based on an elimination method or the like. Because the elimination method is generally performed using floating point calculation, rounding errors may occur. On the other hand, since it is known that the inverse transformation matrix $A^{-1}$ is an integer coefficient matrix, when rational numbers are used in calculation processes, the final result is reduced to lowest terms by an integer.

For this reason, in processing by computer, it is possible to obtain the inverse transformation matrix $A^{-1}$ by an elimination method using rational numbers. The rational number may include a numerator and a denominator. For example, since the numerator and the denominator are integers, when multiple-length integers are used in all processes, it is possible to perform calculation without rounding errors.

3. Searching Method of Transformation Matrix for Entropy Reducing

In the first embodiment, as described in the examples, entropy may be reduced. Next, a method of obtaining the transformation matrix A for entropy reducing will be described.

For simplification, the case of N=2 will be described. First, a matrix $T_1$ and a matrix $T_2$ represented by Equation 17 are considered.

$$T_1 = \begin{pmatrix} 1 & 1 \\ 0 & 1 \end{pmatrix}, \quad T_2 = \begin{pmatrix} 1 & 0 \\ 1 & 1 \end{pmatrix} \quad \text{[Equation 17]}$$

According to Jean-Pierre Serre, "A Course in Arithmetic (Graduate Texts in Mathematics)", Springer-Verlag New York, 1973, a certain integer coefficient 2-by-2 matrix may be represented by a product of the matrix $T_1$ and the matrix $T_2$. For example, by using an appropriate integer string $n_1$, $n_2$, ..., $n_m$, the transformation matrix A of the integer coefficient 2-by-2 matrix may be represented by Equation 18.

$$A = T_1^{n_1} \cdot T_2^{n_2} \ldots T_1^{n_{m-1}} \cdot T_2^{n_m} \quad \text{[Equation 18]}$$

On the other hand, a matrix S represented by Equation 19 is considered.

$$S = \begin{pmatrix} 0 & -1 \\ 1 & 0 \end{pmatrix} \quad \text{[Equation 19]}$$

Based on a well-known theorem, as represented in Equation 20, the matrix S may be represented by a product of the matrix $T_1$ and the matrix $T_2$.

$$S = T_1^{-1} \cdot T_2 \cdot T_1^{-1} \quad \text{[Equation 20]}$$

Therefore, similarly, a certain integer coefficient 2-by-2 matrix may be represented by the product of the matrix $T_1$ and the matrix $T_2$.

In the first embodiment, by multiplying the matrix $T_1$ and the matrix $T_2$, entropy may be effectively reduced.

A matrix $T_1^n$ is generally represented by Equation 21.

$$T_1^n = \begin{pmatrix} 1 & n \\ 0 & 1 \end{pmatrix} \quad \text{[Equation 21]}$$

In this case, the number of matrices to be searched is infinite. On the other hand, in the first embodiment, by taking a remainder by 256, for a certain 2-byte character string v which is represented by Equation 22, Equation 23 is established.

$$v = \begin{pmatrix} v_1 \\ v_2 \end{pmatrix} \quad \text{[Equation 22]}$$

$$T_1^{256} \cdot \begin{pmatrix} v_1 \\ v_2 \end{pmatrix} \% 256 = \begin{pmatrix} 1 & 256 \\ 0 & 1 \end{pmatrix} \cdot \begin{pmatrix} v_1 \\ v_2 \end{pmatrix} \% 256 \quad \text{[Equation 23]}$$
$$= \begin{pmatrix} v_1 + 256 v_2 \\ v_2 \end{pmatrix} \% 256 = \begin{pmatrix} v_1 \\ v_2 \end{pmatrix}$$

Therefore, by searching Equation 24 using the appropriate string $n_1, n_2, \ldots, n_m$ of integers from 0 to 256, it is possible to obtain the integer coefficient 2-by-2 matrix.

$$T_1^{n_1} \cdot T_2^{n_2} \ldots T_1^{n_{m-1}} \cdot T_2^{n_m} \quad \text{[Equation 24]}$$

Based on the integer coefficient 2-by-2 matrix, Equation 25 is represented as follows.

$$\begin{pmatrix} a & b \\ c & d \end{pmatrix} \cdot \begin{pmatrix} v_1 \\ v_2 \end{pmatrix} \% 256 = \begin{pmatrix} a \% 256 & b \% 256 \\ c \% 256 & d \% 256 \end{pmatrix} \cdot \begin{pmatrix} v_1 \\ v_2 \end{pmatrix} \% 256 \quad \text{[Equation 25]}$$

Thus, the number of matrices to be searched is finite, and the string $n_1, n_2, \ldots, n_m$ of integers from 0 to 256 has a finite length.

It is assumed that the data is a byte string (a) as follows.

$$d_1 d_2 d_3 \quad \text{(a)}$$

In this case, the data is stored in a 2-by-K matrix M in a manner represented by Equation 26.

$$M = \begin{pmatrix} d_1 & d_3 & d_5 & \cdots \\ d_2 & d_4 & d_6 & \cdots \end{pmatrix} \quad \text{[Equation 26]}$$

The data may be stored in a manner represented by Equation 27.

$$M = \begin{pmatrix} d_1 & d_2 & d_3 & \cdots \\ d_{K+1} & d_{K+2} & d_{K+3} & \cdots \end{pmatrix} \quad \text{[Equation 27]}$$

The matrix M is hereinafter described by Equation 26, and is referred to as a data matrix. The data matrix M is multiplied 0 to 255 times by the matrix $T_1$ as represented by Equation 28.

$$T_1^0 \cdot M \% 256, T_1^1 \cdot M \% 256, \ldots, T_1^{255} \cdot M \% 256 \quad \text{[Equation 28]}$$

In all patterns of Equation 28, only a first component changes.

For example, only the entropy of 1-byte symbols of the first component changes. For this reason, among all patterns represented in Equation 28, a pattern in which entropy of 1-byte symbols of the first component has the lowest value, is searched. Assuming that $\alpha_1$ is the number of times of multiplications of the matrix $T_1$ in the specified pattern, Equation 29 is represented as follows.

$$T_1^{\alpha_1} \cdot M \% 256 \quad \text{[Equation 29]}$$

As represented by Equation 30, Equation 29 is multiplied by the matrix $T_2$ 0 to 255 times.

$$T_2^0 \cdot T_1^{\alpha_1} \cdot M \% 256, T_2^1 \cdot T_1^{\alpha_1} \cdot M \% 256, \ldots$$
$$, T_2^{255} \cdot T_1^{\alpha_1} \cdot M \% 256 \quad \text{[Equation 30]}$$

In all patterns of Equation 30, only a second component changes.

For example, only the entropy of 1-byte symbols of the second component changes. For this reason, among all patterns represented in Equation 30, a pattern in which entropy of 1-byte symbols of the second component has the lowest value, is searched. It is assumed that $\alpha_2$ is the number of times of multiplications of the matrix $T_2$ in the specified pattern.

In a case where the above procedure is executed, for example, three times, in the first execution, Equation 31 is obtained by obtaining $\alpha_1$ which is the number of times of multiplications of the matrix $T_1$, and $\alpha_2$ which is the number of times of multiplications of the matrix $T_2$.

$$M' := T_2^{\alpha_2} \cdot T_1^{\alpha_1} \cdot M \% 256 \quad \text{[Equation 31]}$$

In the second execution, Equation 32 is obtained by obtaining $\alpha_3$ which is the number of times of multiplications of the matrix $T_1$, and $\alpha_4$ which is the number of times of multiplications of the matrix $T_2$.

$$M' := T_2^{\alpha 4} \cdot T_1^{\alpha 3} \cdot T_2^{\alpha 2} \cdot T_1^{\alpha 1} \cdot M \% 256 \quad \text{[Equation 32]}$$

In the third execution, Equation 33 is obtained by obtaining $\alpha_5$ which is the number of times of multiplications of the matrix $T_1$, and $\alpha_6$ which is the number of times of multiplications of the matrix $T_2$.

$$M' := T_2^{\alpha 6} \cdot T_1^{\alpha 5} \cdot T_2^{\alpha 4} \cdot T_1^{\alpha 3} \cdot T_2^{\alpha 2} \cdot T_1^{\alpha 1} \cdot M \% 256 \quad \text{[Equation 33]}$$

In a case where the above procedure is executed a certain number of times, the matrix M' is represented by Equation 34.

$$M' := T_2^{\alpha m} \cdot T_1^{\alpha m-1} \ldots T_2^{\alpha 2} \cdot T_1^{\alpha 1} \cdot M \% 256 \quad \text{[Equation 34]}$$

Since the matrix M' is a 2-by-K matrix, Equation 34 is represented by Equation 35.

$$M' := \begin{pmatrix} d'_1 & d'_3 & d'_5 & \cdots \\ d'_2 & d'_4 & d'_6 & \cdots \end{pmatrix} \quad \text{[Equation 35]}$$

All components $d'_i$ (i=1, 2, . . . ) of Equation 35 are represented by 2K bytes. Each component $d'_i$ is an integer from 0 to 255 as represented by Equation 36.

$$d'_i \in [0, 255] \quad \text{[Equation 36]}$$

Based on Equation 34, the transformation matrix A is represented by Equation 37.

$$A = T_2^{\alpha m} \cdot T_1^{\alpha m-1} \ldots T_2^{\alpha 2} \cdot T_1^{\alpha 1} \quad \text{[Equation 37]}$$

As described in Equation 14 and Equation 15, the appearance frequencies of 1-byte symbols (a plurality of 1-byte symbols) of the matrix M' are changed to be biased (such that entropy is reduced), and thus the entropy may be reduced to be smaller than entropy of 1-byte symbols of the original matrix M. Thereby, the entropy of the 1-byte symbols is reduced.

In a case of restoring the matrix M' to the byte string (a), it is preferable to prepare m bytes of $\alpha_1, \alpha_2, \ldots, \alpha_m$ indicating powers (0 to 255) of each of the matrix $T_1$ and the matrix $T_2$. Hereinafter, $\alpha_1, \alpha_2, \ldots, \alpha_m$ are referred to as an exponent string. This information is stored in a header, and the changed data for reducing the entropy of the entire data is stored in a body. Details of a storage format will be described with reference to FIG. 11.

In the first embodiment, as described above, it is preferable to determine the transformation matrix A by alternately multiplying the matrix $T_1$ raised to the power $\alpha_i$ and the matrix $T_2$ raised to the power $\alpha_{i+1}$ m times. On the other hand, the transformation matrix A may be determined by any one of the matrix $T_1$ and the matrix $T_2$. For example, the transformation matrix A may be determined by the matrix $T_1$ raised to a predetermined power, or the transformation matrix A may be determined by the matrix $T_2$ raised to a predetermined power.

The above-described method according to the first embodiment may be all realized by a computer. The method according to the first embodiment may be realized by a computer in a certain N-dimension instead of a two-dimension. For example, in a case where N is 3, the above example may be performed in a two-dimensional space configured with a first component and a second component, and the result may be processed in a two-dimensional space configured with a second component and a third component.

4. Storage Format of Entropy-Reduced Data

Figure 11:
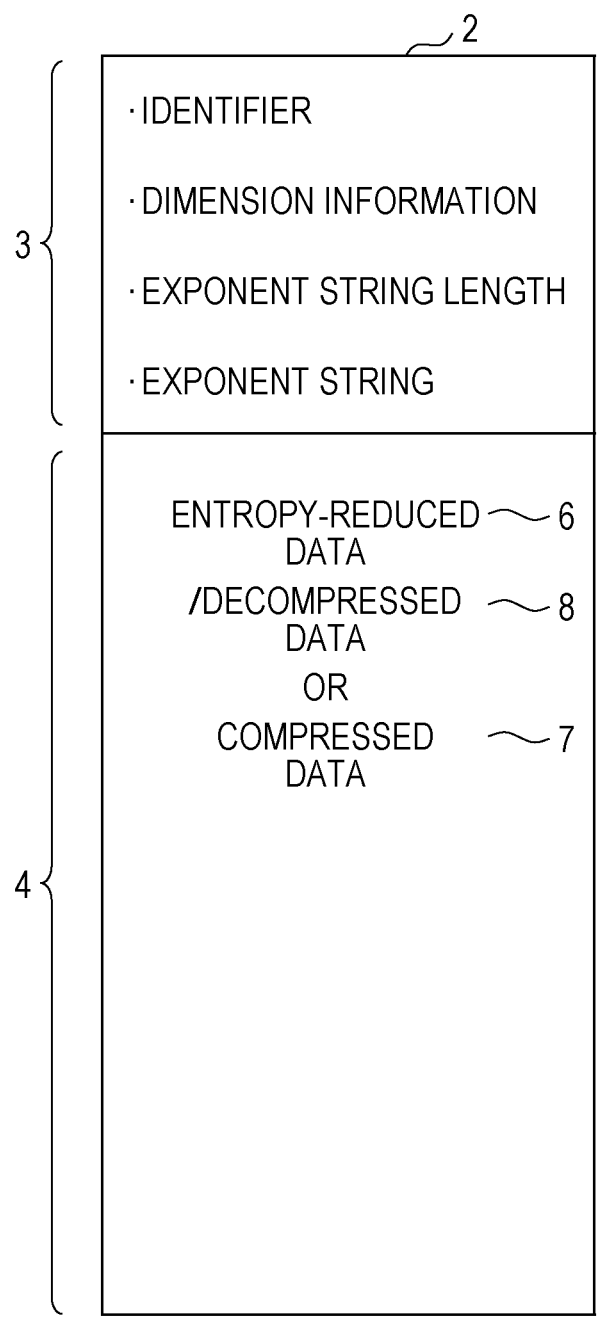
FIG. 11 is a diagram illustrating an example of a storage format.

In the first embodiment, the entropy-reduced data is stored in a storage format as illustrated in FIG. 11.

FIG. 11 is a diagram illustrating an example of a storage format. In the first embodiment, a storage format 2 for storing entropy-reduced data 6 obtained by reducing entropy of the original byte string (a), includes a header 3 and a body 4. Based on the storage format 2, the entropy-reduced data 6 is stored in a storage area 9 (FIG. 13) of the memory 130 to be described.

The header 3 stores data such as an identifier, dimension information, the number of exponents, and an exponent string. The identifier is information indicating that the body 4 stores the changed data. The identifier is represented by, for example, a 4-byte symbol. The dimension information indicates a level of a dimension in which processing is performed. In a case where processing is performed in a two-dimension, the dimension information indicates "2".

An exponent string length indicates a length (m bytes) of the exponent string $\alpha_1, \alpha_2, \ldots, \alpha_m$ representing the powers (0 to 255) of each of the matrix $T_1$ and the matrix $T_2$. The exponent string indicates $\alpha_1, \alpha_2, \ldots, \alpha_m$. Each $\alpha_1, \alpha_2, \ldots, \alpha_m$ is represented by 1 byte, and the entire exponent string is represented by m bytes.

First, the body 4 stores the entropy-reduced data 6 represented by each component of the 2-by-K matrix M'. The entropy-reduced data 6 is stored in order of $d_1', d_2', \ldots, d_{2K}'$ according to $d_1, d_2, d_3 \ldots$ of the original byte string (a). When the original byte string (a) is not a multiple of 2, the remaining 1 byte is stored. After compression of the entropy-reduced data 6, the compressed data is stored in the body 4.

5. Compression of Data

In the first embodiment, the entropy-reduced data 6 which is stored in the body 4 is acquired, and the acquired entropy-reduced data 6 is compressed using a known lossless compression technique such as arithmetic coding. The body 4 is replaced with the compressed data 7.

6. Decompression of Data

The compressed data is decompressed using a decompression technique corresponding to a known lossless compression technique such as arithmetic coding. The decompressed data 8 corresponds to the entropy-reduced data 6 with reduced entropy.

A reverse procedure to the entropy reducing procedure is performed on the entropy-reduced data 6. Details are described below.

For simplification, the case of a two dimension will be described. As illustrated in FIG. 11, from the header 3 of the storage format 2, m byte data of the exponent string $\alpha_1, \alpha_2, \ldots, \alpha_m$ indicating powers of each of the matrix $T_1$ and the matrix $T_2$ is read. Based on the exponent string $\alpha_1, \alpha_2, \ldots, \alpha_m$, the decompressed data is expanded in the memory 130 (FIG. 12) as represented by Equation 38.

$$T_1^{256-\alpha 1} \cdot T_2^{256-\alpha 2} \ldots T_1^{256-\alpha m-1} \cdot T_2^{256-\alpha m} \cdot M' \% 256 \quad \text{[Equation 38]}$$

Equation 38 may be executed by a computer.

Equation 38 corresponds to a reverse procedure to the entropy reducing procedure. This is because Equation 39 is established and the same relationship is established in the matrix $T_2$.

$$T_1^{256-\alpha 1} \cdot T_1^{\alpha 1} \% 256 = T_1^{256} \% 256 = 1 \quad \text{[Equation 39]}$$

Therefore, Equation 40 is represented as follows.

$$T_1^{256-\alpha 1} \cdot T_2^{256-\alpha 2} \ldots T_1^{256-\alpha m-1} \cdot T_2^{256-\alpha m} \cdot M' \bmod 256 = M' \% 256 \quad \text{[Equation 40]}$$

Thereby, the original data (byte string (a)) may be obtained.

7. Restoring of Original Data

By reading the components of the matrix M from the area in which the matrix M obtained from the Equation 40 is stored, in a predetermined order, the byte string (a), that is, the original data is acquired. The first embodiment based on the above-described method is realized by the information processing apparatus 100 as illustrated in FIG. 12.

FIG. 12 is a hardware configuration diagram of the information processing apparatus. In FIG. 12, the information processing apparatus 100 is an information processing apparatus controlled by a computer, includes a central processing unit (CPU) 11, a first memory 12, a second memory 13, an input device 14, a display 15, a communication interface (I/F) 17, and a drive device 18, and is connected to a bus B.

The CPU 11 corresponds to a processor that controls the information processing apparatus 100 according to a program stored in the first memory 12. A random access memory (RAM), a read only memory (ROM), or the like is used as the first memory 12. A program to be executed by the CPU 11, data to be used in processing by the CPU 11, data obtained by processing by the CPU 11, and the like are stored or temporarily held in the first memory 12.

A hard disk drive (HDD) or the like is used as the second memory 13, and the second memory 13 stores data such as a program for executing various processing. Various processing is realized by loading a part of the program stored in the second memory 13 into the first memory 12, and executing the loaded program by the CPU 11.

The input device 14 includes a mouse, a keyboard, and the like, and is used to allow a user to input various information for processing by the information processing apparatus 100. The display 15 displays various information under the control of the CPU 11. The input device 14 and the display 15 may be a user interface such as an integrated touch panel. The communication I/F 17 performs communication via a network such as a wired network or a wireless network. The communication by the communication I/F 17 is not limited to wireless communication or wired communication. The program for realizing the processing performed by the information processing apparatus 100 is provided to the information processing apparatus 100, for example, by a storage medium 19 such as a compact disc read-only memory (CD-ROM).

The drive device 18 performs interface between the storage medium 19 (for example, a CD-ROM or the like) set in the drive device 18 and the information processing apparatus 100.

A program for realizing various processing according to the present embodiment is stored in the storage medium 19, and the program stored in the storage medium 19 is installed in the information processing apparatus 100 via the drive device 18. The installed program may be executed by the information processing apparatus 100.

The storage medium 19 which stores the program is not limited to a CD-ROM, and may be one or more non-transitory tangible computer-readable medium which has a data structure. As the computer-readable storage medium, in addition to a CD-ROM, a portable storage medium such as a digital versatile disk (DVD) or a USB memory, or a semiconductor memory such as a flash memory may be used.

Figure 13:
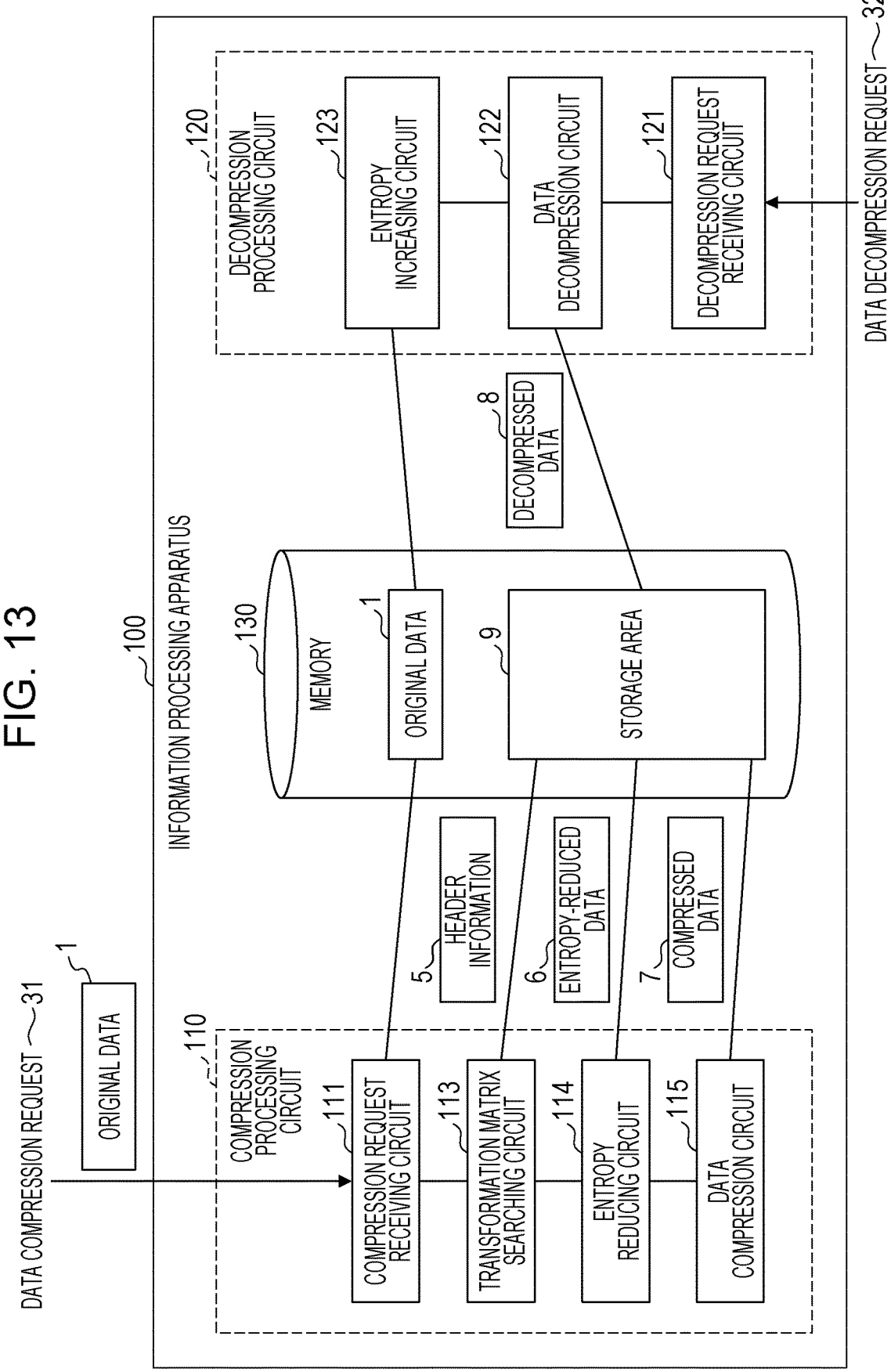
FIG. 13 is a diagram illustrating a functional configuration example of the information processing apparatus according to a first embodiment.

FIG. 13 is a diagram illustrating a functional configuration example of the information processing apparatus according to the first embodiment. In FIG. 13, the information processing apparatus 100 mainly includes a compression processing circuit 110 and a decompression processing circuit 120. The memory 130 stores original data 1, header information 5, entropy-reduced data 6, compressed data 7, decompressed data 8, and the like.

At least the header information 5, the entropy-reduced data 6, the compressed data 7, and the decompressed data 8 are stored in the storage area 9 according to the storage format 2 illustrated in FIG. 11. The compression processing circuit 110 and the decompression processing circuit 120 may be respectively provided in different information processing apparatuses 100. The storage area 9 corresponds to a data file with the storage format 2.

The compression processing circuit 110 transforms the original data 1 into entropy-reduced data according to the present embodiment, and compresses the entropy-reduced data. The compression processing circuit 110 may suppress an increase in data capacity during data compression processing.

The compression processing circuit 110 includes a compression request receiving circuit 111, a transformation matrix searching circuit 113, an entropy reducing circuit 114, and a data compression circuit 115. Each of the compression request receiving circuit 111, the transformation matrix searching circuit 113, the entropy reducing circuit 114, and the data compression circuit 115 is realized by processing performed by an execution of a program corresponding to each circuit by the CPU 11.

When receiving a data compression request 31 from a user, the compression request receiving circuit 111 stores the original data 1 included in the data compression request 31 in the memory 130, and transfers the compression request of the original data 1 to the transformation matrix searching circuit 113. The user may input the data compression request 31 by designating the original data 1 stored in the memory 130. The original data 1 may be provided from a data file. In this case, the original data 1 corresponds to compression target data in the data file.

In response to the compression request from the compression request receiving circuit 111, the transformation matrix searching circuit 113 performs transformation matrix searching processing for the original data 1 stored in the memory 130. According to the transformation matrix searching processing, by acquiring the exponent $\alpha_i$ indicating the number of times of multiplications of each of the matrix $T_1$ and the matrix $T_2$ when alternately multiplying the matrix M representing the original data 1 by the matrix $T_1$ and the matrix $T_2$, the exponent string $\alpha_1, \alpha_2, \ldots, \alpha_m$ and the exponent string length are obtained.

Based on a result of the transformation matrix searching processing, the header information 5 is stored in the storage area 9 according to the storage format 2. The header information 5 includes an identifier, dimensional information, an exponent string length, an exponent string $\alpha_1, \alpha_2, \alpha_m$.

The entropy reducing circuit 114 acquires the exponent string $\alpha_1, \alpha_2, \ldots, \alpha_m$ from the storage area 9, and acquires each component of the matrix M', that is, the entropy-reduced data 6 by Equation 34. The entropy-reduced data 6 is stored in the body 4 of the storage area 9.

The data compression circuit 115 performs data compression processing of the entropy-reduced data 6, which is stored in the storage area 9 by the entropy reducing circuit 114, and stores the compressed data 7 in the body 4 of the storage area 9. The entropy-reduced data 6 is replaced with the compressed data 7. In the data compression processing, data compression may be performed by arithmetic coding or the like.

The decompression processing circuit 120 restores the original data 1 by decompressing the compressed data 7 and increasing entropy of the decompressed data. In the present embodiment, since the data compression is performed in a lossless manner, the original data 1 may be completely restored.

The decompression processing circuit 120 includes a decompression request receiving circuit 121, a data decompression circuit 122, and an entropy increasing circuit 123. Each of the decompression request receiving circuit 121, the data decompression circuit 122, and the entropy increasing circuit 123 is realized by processing performed by an execution of a program corresponding to each circuit by the CPU 11.

When receiving a data decompression request 32 from a user, the decompression request receiving circuit 121 transfers the decompression request of the compressed data 7, which is designated by the data decompression request 32 and is stored in the storage area 9, to the data decompression circuit 122. The user may input the data decompression request 32 by designating an external memory area in which the compressed data 7 is stored based on the storage format 2. In this case, the compressed data 7 in the external memory area is read by the information processing apparatus 100, and is stored in the storage area 9 of the memory 130.

In response to the decompression request of the compressed data 7 from the decompression request receiving circuit 121, the data decompression circuit 122 acquires decompressed data 8 by performing data decompression processing of the compressed data 7 in the storage area 9. The body 4 of the storage area 9 is replaced with the decompressed data 8, that is, the entropy-reduced data 6. In the data decompression processing, the compressed data 7 may be decompressed by arithmetic coding or the like.

In response to ending of the data decompression processing, the entropy increasing circuit 123 restores the original data 1 by performing processing of increasing entropy of the decompressed data 8. The entropy increasing circuit 123 restores the original data 1 by acquiring the dimension information, the exponent string, and the like from the header 3 of the storage area 9, generating an inverse transformation matrix $A^{-1}$ for increasing entropy, and multiplying the decompressed data 8 by the inverse transformation matrix $A^{-1}$. In a case where the identifier of the header 3 indicates that entropy reducing is not performed, the entropy increasing processing by the entropy increasing circuit 123 is suppressed.

Figure 14:
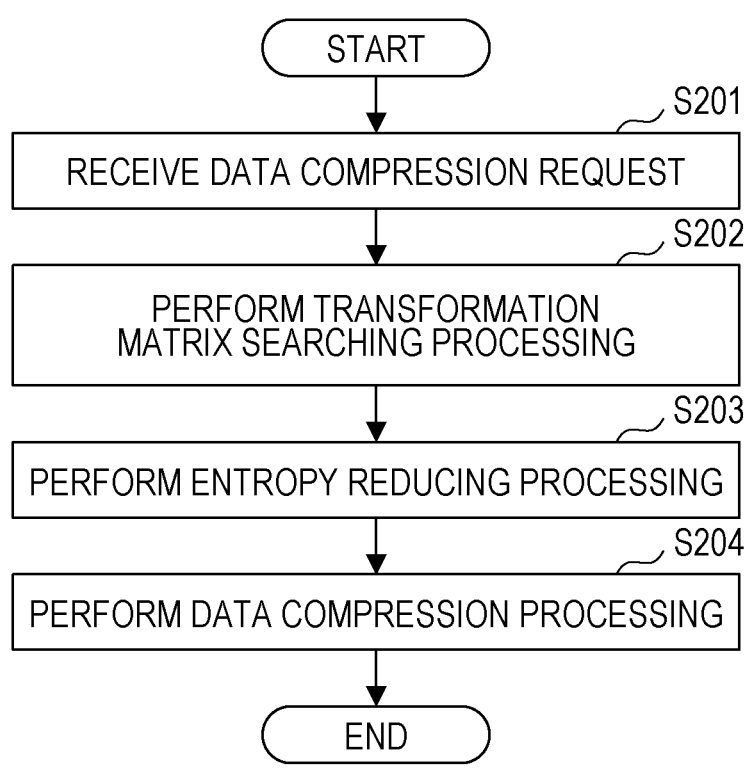
FIG. 14 is a flowchart for explaining an outline of compression processing according to the first embodiment.

FIG. 14 is a flowchart for explaining an outline of the compression processing according to the first embodiment. In FIG. 14, when a user inputs a data compression request 31 to the information processing apparatus 100, the compression request receiving circuit 111 of the compression processing circuit 110 receives the data compression request 31 (step S201). The compression request receiving circuit 111 notifies the transformation matrix searching circuit 113 of the compression request of the original data 1.

In response to the notification of the compression request from the compression request receiving circuit 111, the transformation matrix searching circuit 113 performs transformation matrix searching processing of obtaining an optimum transformation matrix A (Equation 37) which reduces an amount of data when data compression processing of the original data 1 is performed (step S202).

When the transformation matrix A is obtained, the entropy reducing circuit 114 performs entropy reducing processing of reducing entropy of the original data 1 by using the transformation matrix A (step S203).

When the entropy-reduced data 6 is obtained, the data compression circuit 115 performs data compression processing of the entropy-reduced data 6 (step S204). The compressed data 7 is stored in the body 4 of the storage area 9.

Figure 15:
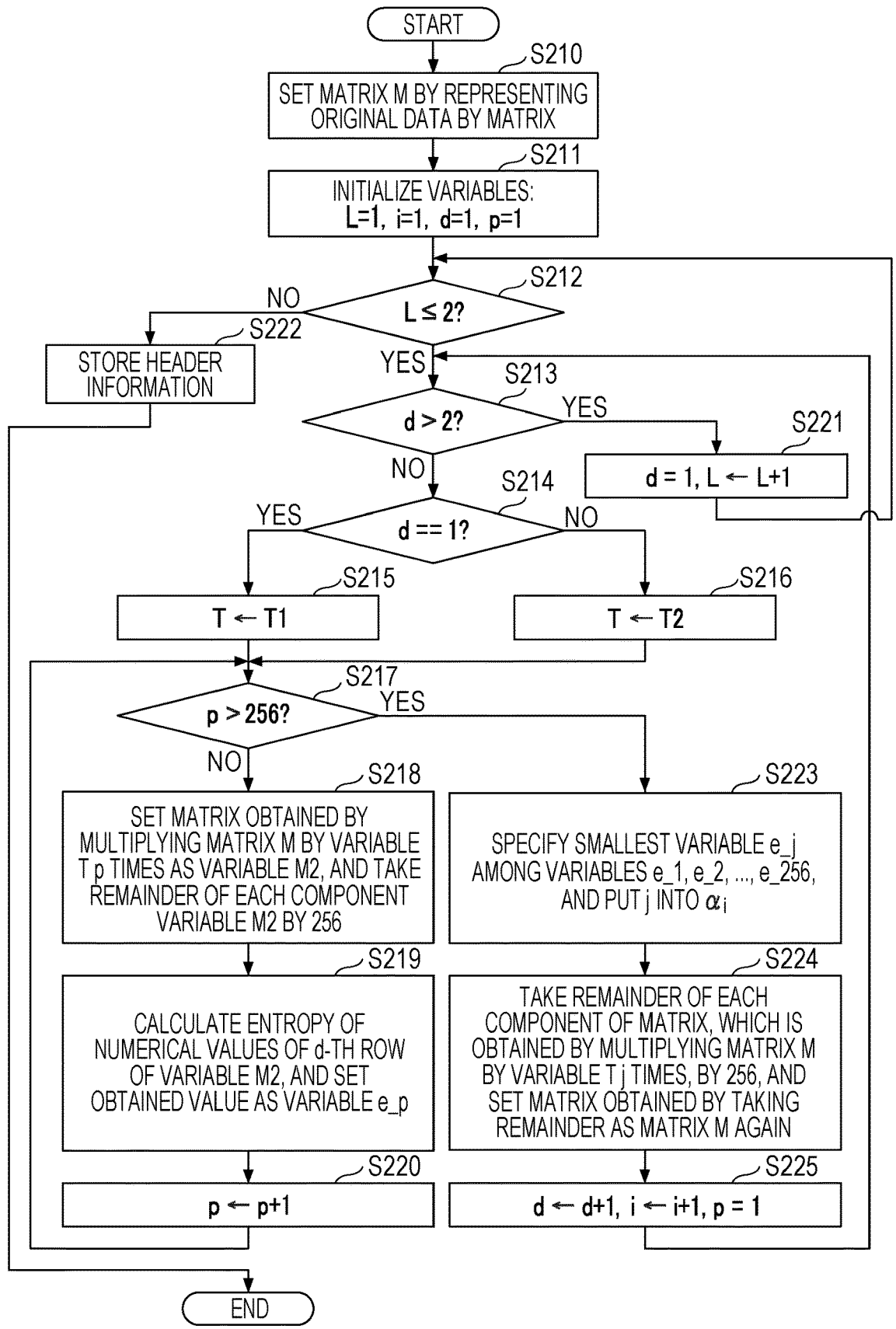
FIG. 15 is a flowchart for explaining transformation matrix searching processing according to the first embodiment.

FIG. 15 is a flowchart for explaining the transformation matrix searching processing according to the first embodiment. In FIG. 15, although a case where the dimension N is 2 is explained, the present embodiment is not limited to the case of N=2.

In FIG. 15, the transformation matrix searching circuit 113 reads the original data 1, represents the original data 1 by a matrix, and sets initial values of a 2-by-K matrix M (hereinafter, referred to as a matrix M) (step S210). The transformation matrix searching circuit 113 initializes variables L, i, d, and p to 1 (step S211).

The transformation matrix searching circuit 113 determines whether the variable L is equal to or smaller than 2 (step S212). In a case where the variable L is equal to or smaller than 2 (YES in step S212), the transformation matrix searching circuit 113 determines whether the variable d is larger than 2 (step S213). In a case where the variable d is equal to or smaller than 2 (NO in step S213), the transformation matrix searching circuit 113 determines whether the variable d is 1 (step S214).

In a case where the variable d is 1 (YES in step S214), the transformation matrix searching circuit 113 sets the matrix $T_1$ as a variable T (step S215), and proceeds to step S217. On the other hand, in a case where the variable d is not 1 (NO in step S214), the transformation matrix searching circuit 113 sets the matrix $T_2$ as a variable T (step S216), and proceeds to step S217.

The transformation matrix searching circuit 113 determines whether the variable p is larger than 256 (step S217). In a case where the variable p is equal to or smaller than 256 (NO in step S217), the transformation matrix searching circuit 113 sets a matrix obtained by multiplying the matrix M by the variable T p times as a variable M2, and takes a remainder of each component of the variable M2 by 256 (step S218).

The transformation matrix searching circuit 113 calculates entropy of numerical values of a d-th row of the variable M2, and sets the obtained value as a variable e_p (step S219). The transformation matrix searching circuit 113 increments the variable p by 1 (step S220), and returns to step S217.

On the other hand, in a case where the variable p is larger than 256 (YES in step S217), the transformation matrix searching circuit 113 specifies a smallest variable e_j among variables e_1, e_2, . . . , e_256, and puts j into $\alpha_i$ (step S223).

The transformation matrix searching circuit 113 takes a remainder of each component of the matrix, which is obtained by multiplying the matrix M by the variable T j times, by 256, and sets again a matrix obtained by taking the remainder as the matrix M (step S224). Thereafter, the transformation matrix searching circuit 113 increments the variable d and the variable i by 1, sets the variable p to 1 (step S225), returns to step S213, and repeats the same processing described above.

In a case where the variable L is larger than 2 (NO in step S212), the transformation matrix searching circuit 113 stores the header information 5 in the header 3 of the storage area 9 of the memory 130 (step S222). The obtained exponent string $\alpha_1, \alpha_2, \ldots, \alpha_m$ and the obtained exponent string length are included in the header information 5. The transformation matrix searching processing is ended.

Figure 16:
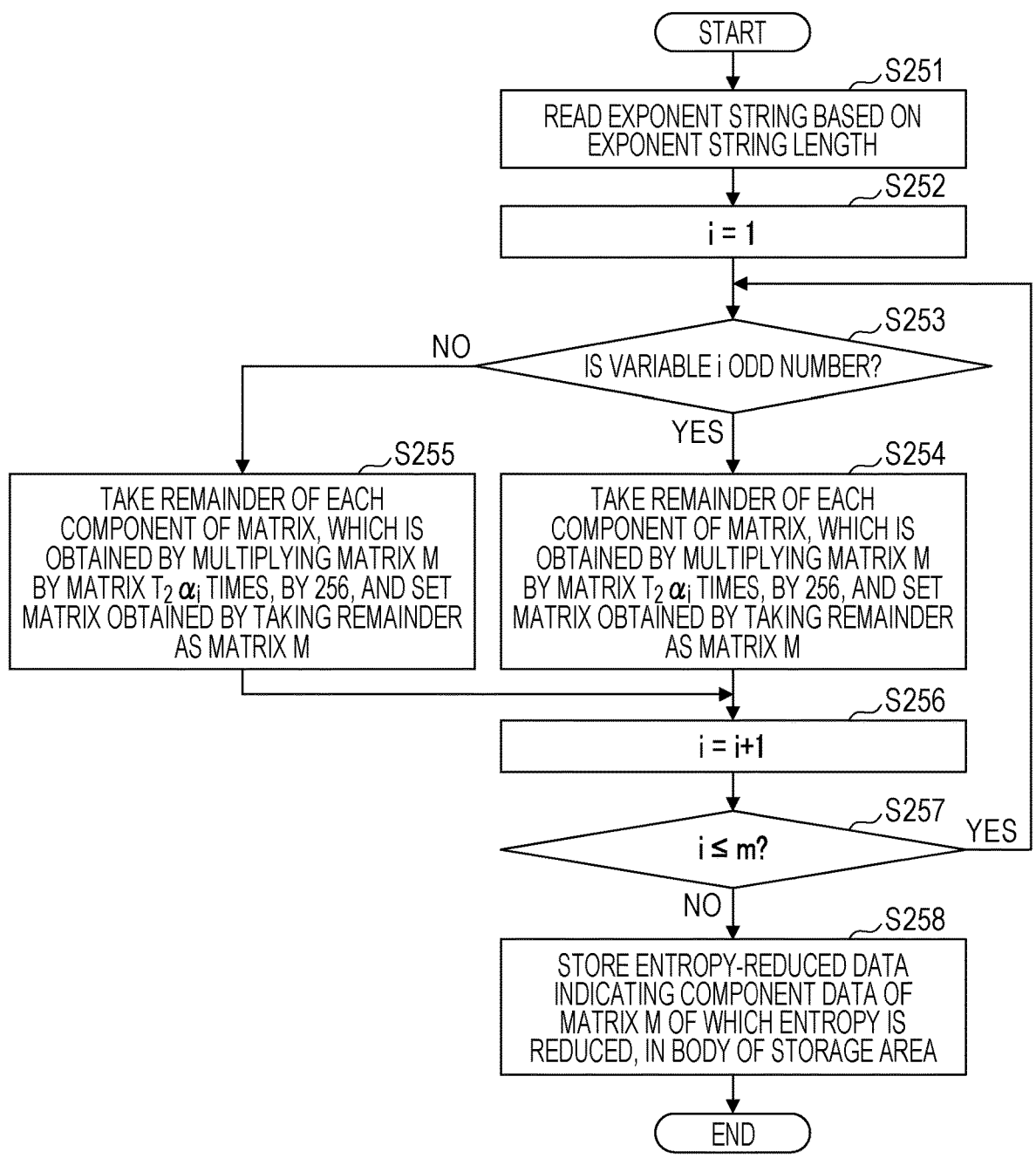
FIG. 16 is a flowchart for explaining entropy reducing processing according to the first embodiment.

FIG. 16 is a flowchart for explaining entropy reducing processing according to the first embodiment. In FIG. 16, the entropy reducing circuit 114 reads the exponent string from the header 3 of the storage area 9 based on the exponent string length (step S251), and initializes the variable i to 1 (step S252). It is assumed that the exponent string length is m.

The entropy reducing circuit 114 determines whether the variable i is an odd number (step S253). In a case where the variable i is an odd number (YES in step S253), the entropy reducing circuit 114 takes a remainder of each component of a matrix, which is obtained by multiplying the matrix M by the matrix $T_1$ $\alpha_i$ times, by 256, sets a matrix obtained by taking the remainder as the matrix M (step S254), and proceeds to step S256.

On the other hand, in a case where the variable i is an even number (NO in step S253), the entropy reducing circuit 114 takes a remainder of each component of a matrix, which is obtained by multiplying the matrix M by the matrix $T_2$ $\alpha_i$ times, by 256, sets a matrix obtained by taking the remainder as the matrix M (step S255), and proceeds to step S256.

The entropy reducing circuit 114 determines whether the variable i is equal to or smaller than m (exponent string length) (step S257). In a case where the variable i is equal to or smaller than m (YES in step S257), the entropy reducing circuit 114 proceeds to step S253, and repeats the same processing as described above.

On the other hand, in a case where the variable i is larger than m (NO in step S257), the entropy reducing circuit 114 stores the entropy-reduced data 6 indicating component data of the matrix M of which the entropy is reduced, in the body 4 of the storage area 9, based on the storage format 2 (step S258). Thereafter, the entropy reducing circuit 114 ends the entropy reducing processing. The storage area 9 in which the compressed data 7 is stored corresponds to a data file.

The entropy-reduced data 6 is compressed by the data compression circuit 115, and is stored as compressed data 7 in the body 4 of the storage area 9.

Figure 17:
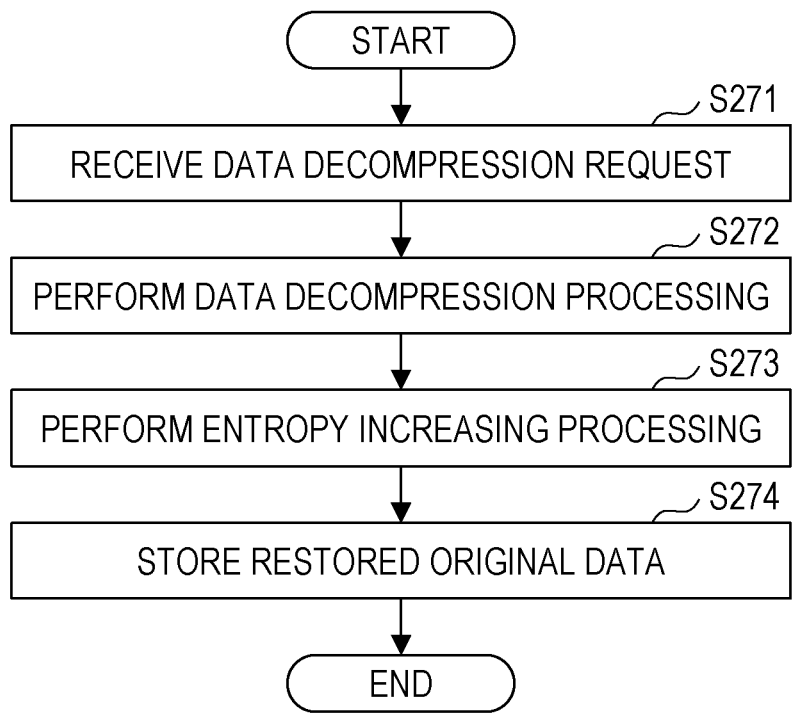
FIG. 17 is a flowchart for explaining decompression processing according to the first embodiment.

Next, an outline of decompression processing by the decompression processing circuit 120 will be described. FIG. 17 is a flowchart for explaining decompression processing according to the first embodiment. In FIG. 17, when the decompression request receiving circuit 121 receives a data decompression request 32 from a user (step S271), the decompression processing circuit 120 notifies the data decompression circuit 122 of the decompression request of the compressed data 7.

The data decompression circuit 122 reads the compressed data 7 from the body 4 of the storage area 9, and performs data decompression processing (step S272). The decompressed data 8 is stored in the body 4. When the decompressed data 8 is obtained, the entropy increasing circuit 123 performs entropy increasing processing (step S273). By the entropy increasing processing, the original data 1 is restored (step S274).

Figure 18:
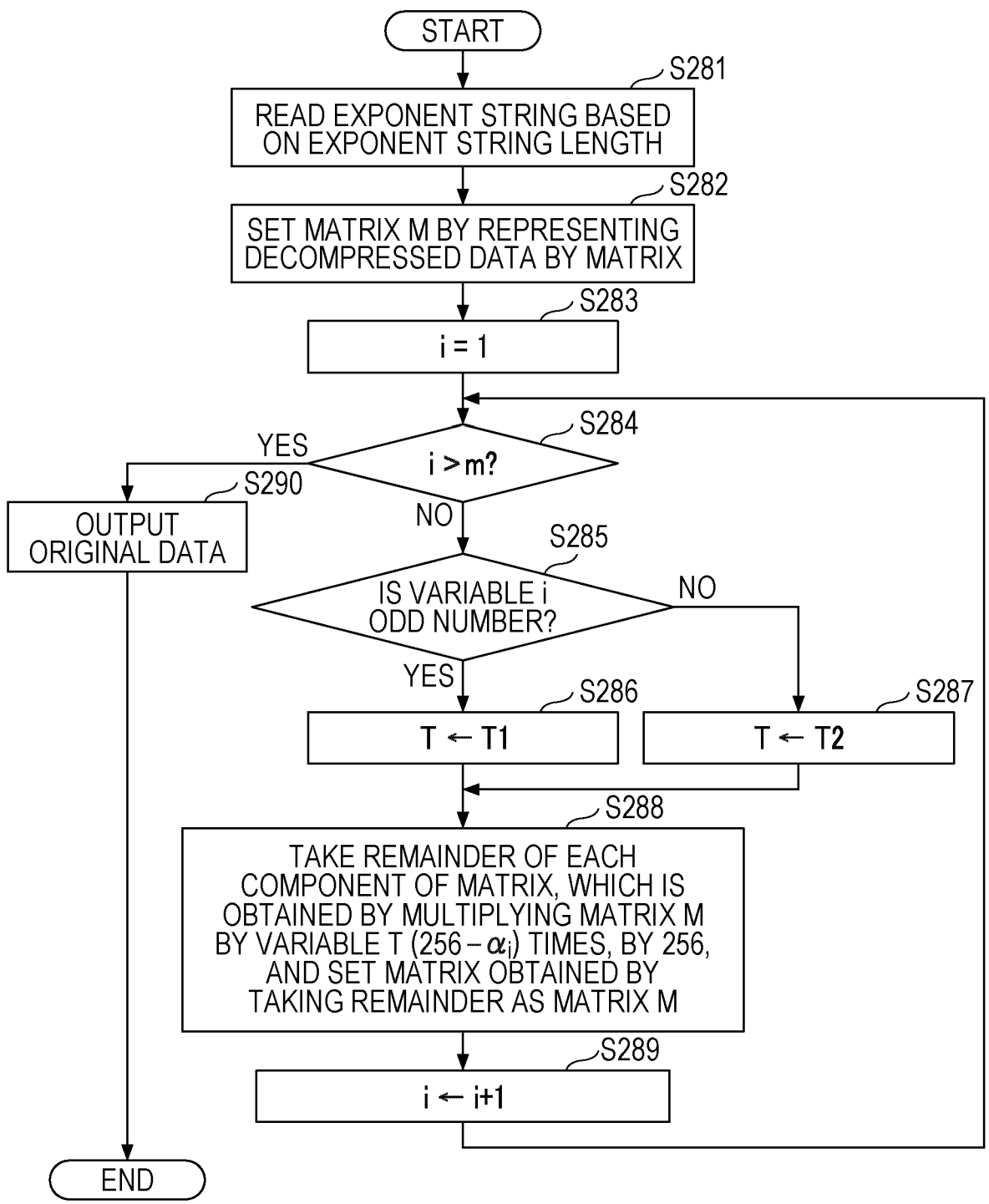
FIG. 18 is a flowchart for explaining entropy increasing processing according to the first embodiment.

FIG. 18 is a flowchart for explaining entropy increasing processing according to the first embodiment. In FIG. 18, the entropy increasing circuit 123 reads the exponent string $\alpha_1$, $\alpha_2$, ..., $\alpha_m$ from the header 3 of the storage area 9, based on the exponent string length (step S281). The exponent string length is set to m.

The entropy increasing circuit 123 sets a matrix M by representing the decompressed data 8, that is, the entropy-reduced data 6 by a matrix (step S282). The entropy increasing circuit 123 initializes the variable i to 1 (step S283).

The entropy increasing circuit 123 determines whether the variable i is larger than m (exponent string length) (step S284). In a case where the variable i is equal to or smaller than m (NO in step S284), the entropy increasing circuit 123 determines whether the variable i is an odd number (step S285).

In a case where the variable i is an odd number (YES in step S285), the entropy increasing circuit 123 sets the matrix $T_1$ as the variable T (step S286), and proceeds to step S288. On the other hand, in a case where the variable i is an even number (NO in step S285), the entropy increasing circuit 123 sets the matrix $T_2$ as the variable T (step S287), and proceeds to step S288.

The entropy increasing circuit 123 takes a remainder of each component of a matrix, which is obtained by multiplying the matrix M by the variable T $(256-\alpha_i)$ times, by 256, and sets a matrix obtained by taking the remainder as the matrix M (step S288). The entropy increasing circuit 123 increments the variable i by 1 (step S289), returns to step S284, and repeats the same processing as described above.

On the other hand, in a case where the variable i is larger than m (YES in step S284), the entropy increasing circuit 123 outputs the original data 1 (step S290), and ends the entropy increasing processing.

As described above, in the first embodiment, entropy may be reduced by biasing the appearance frequencies of 1-byte characters without increasing the number of bytes of data. In the above description, although the case of N=2 is described, the first embodiment may be applied to a case where N is equal to or larger than 3.

Next, a second embodiment of improving efficiency of the entropy reducing according to the first embodiment will be described. In the first embodiment, the searching method of the transformation matrix A for reducing the entropy is described. In the searching of the transformation matrix A, although the matrix $T_1$ and the matrix $T_2$ are multiplied a plurality of times, the entropy does not decrease in all multiplications. There are two factors causing entropy increasing.

One factor causing entropy increasing is an increase in types of appearing symbols. The other factor causing entropy increasing is that symbol types are the same while appearance frequencies are not biased (that is, each symbol has the same appearance frequency). In the former case, a method of suppressing an increase in symbol types will be described.

In the first embodiment, a 1-byte character is processed as an integer value as it is. For example, "0xF0" is processed as an integer value "240", "0x80" is processed as an integer value "80". An alphanumeric character "a" is 0x61, which is 96.

As an example, a case where text data includes ASCII characters "a" and "b" is considered. The characters "a" and "b" are represented by integer values "96" and "97", respectively. In this case, when multiplying the matrix $T_1$ m times (m=1, 2, ..., 255), a matrix $T_1^m$ is obtained as represented by Equation 41.

$$T_1^m = \begin{pmatrix} 1 & m \\ 0 & 1 \end{pmatrix}$$ [Equation 41]

Based on the matrix $T_1^m$, 1-byte symbols are generated as follows.

96, (96+m*97)%256, 97, (97+m*96)%256

For example, (96+m*97)%256 and (97+m*96)%256 have numerical values other than "96" and "97", respectively, unless m is 0. For example, when m=1, (96+m*97)%256 and (97+m*96)%256 have numerical values "193" and "193", respectively, and when m=2, (96+m*97)%256 and (97+m*96)%256 have numerical values "34" and "33", respectively.

A result when m is 0 is the same as a result when any calculation is not performed, and thus entropy does not increase or decrease. Despite an attempt to decrease entropy by setting m to a non-zero value, symbols other than "96" and "97" may appear. Unless appearance frequencies of "96" and "97" are remarkably biased, entropy of 1-byte symbols is increased. For this reason, in the searching of the transformation matrix A according to the first embodiment, it may be difficult to find the transformation matrix A for decreasing entropy.

In the following description, a matrix represented by Equation 42 is used.

$$T_1 := \begin{pmatrix} 1 & 1 \\ 0 & 1 \end{pmatrix}$$ [Equation 42]

The present inventors focus on following facts: "0", "128", "64", and "198" are integer multiples of $\frac{1}{2}^n$ of 256; and there is a property that a matrix calculation result on a torus is within a range of the same symbols and does not generate 1-byte symbols not included in the original data 1.

Entropy tends to increase as the number of types of appearing symbols increases. On the other hand, by converting numerical values of data using a symbol-to-numerical-value conversion table according to a second embodiment to be described, it is possible to suppress an increase in symbol type, thereby suppressing an increase in entropy. The second embodiment is more effective in a case of text data including readable ASCII symbol characters.

A hardware configuration of the information processing apparatus 100 according to the second embodiment is the same as illustrated in FIG. 12, and thus a description thereof will be omitted.

Figure 19:
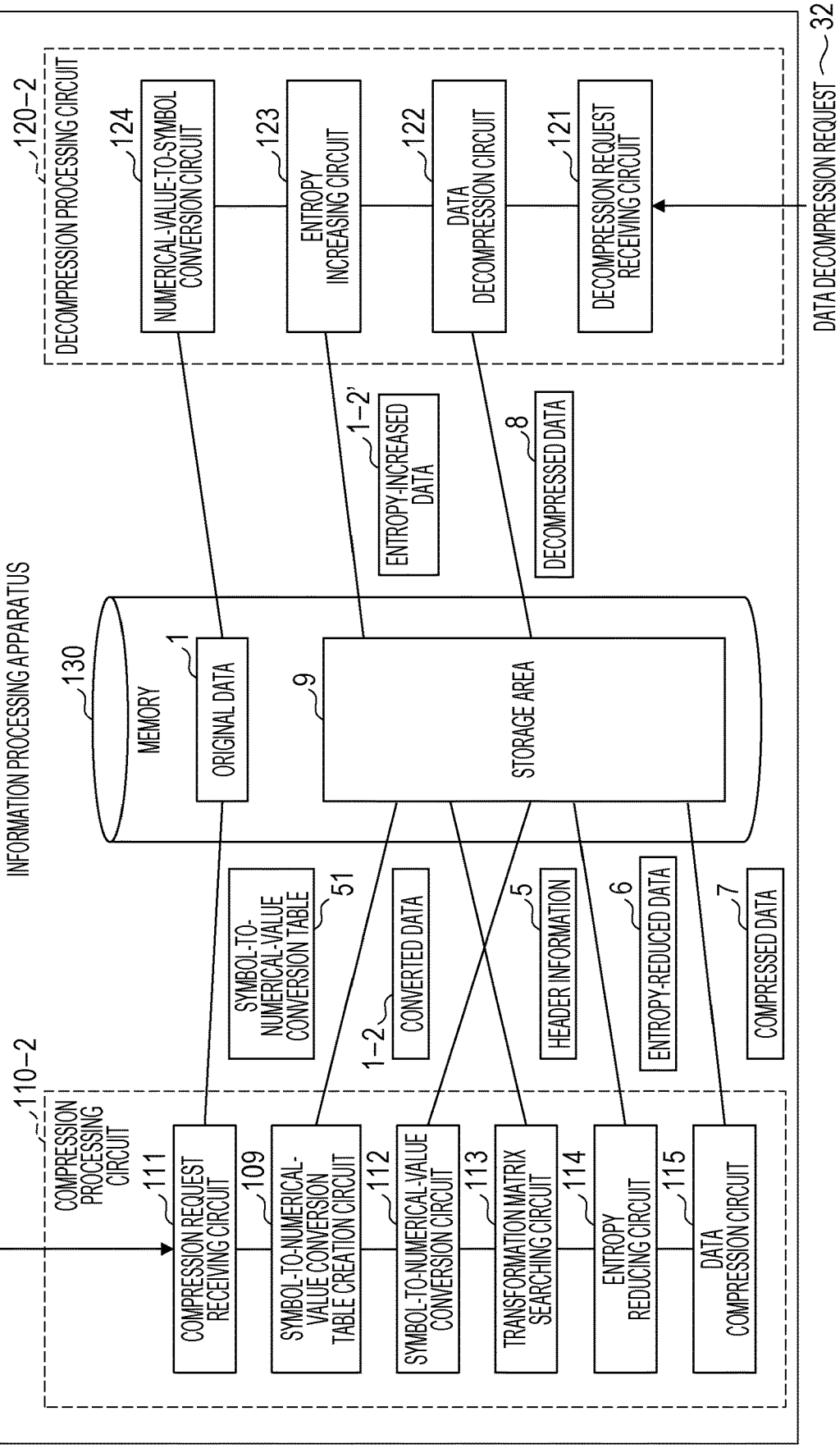
FIG. 19 is a diagram illustrating a functional configuration example of an information processing apparatus according to a second embodiment.

FIG. 19 is a diagram illustrating a functional configuration example of an information processing apparatus 100 according to the second embodiment. In FIG. 19, a difference from the first embodiment is that the compression processing circuit 110-2 further includes a symbol-to-numerical-value conversion table creation circuit 109 and a symbol-to-numerical-value conversion circuit 112, and that the decompression processing circuit 120-2 further includes a numerical-value-to-symbol conversion circuit 124.

The memory 130 further stores a symbol-to-numerical-value conversion table 51, converted data 1-2, and the like. Other processing circuits and data are the same as those in the first embodiment and are denoted by the same reference numerals, and thus a description thereof will be omitted.

In FIG. 19, the symbol-to-numerical-value conversion table creation circuit 109 according to the second embodiment creates a symbol-to-numerical-value conversion table 51 for mapping the 1-byte symbols of the original data 1 to integer multiples of $\frac{1}{2}^n$ of a cycle 256.

The symbol-to-numerical-value conversion table 51 is stored in the header 3 of the storage area 9 based on the storage format 2. The symbol-to-numerical-value conversion table 51 is a symbol-to-numerical-value conversion table 51a (FIG. 20) to be described or a symbol-to-numerical-value conversion table 51b (FIG. 22) to be described. The symbol-to-numerical-value conversion table 51 may be created by the symbol-to-numerical-value conversion table creation circuit 109 according to the data compression request 31 before symbol-to-numerical-value conversion processing is performed by the symbol-to-numerical-value conversion circuit 112, or may be created in advance according to an instruction of a user.

The symbol-to-numerical-value conversion circuit 112 counts the number of appearances for each type of the 1-byte symbols of the original data 1, sorts the types of the 1-byte symbols in descending order of the number of appearances, and replaces the types of the 1-byte symbols in order of high appearance frequency, with numerical values of the symbol-to-numerical-value conversion table 51 in order from the head. Each type of the 1-byte symbols of the original data 1 is replaced with the numerical values based on the symbol-to-numerical-value conversion table 51 according to the appearance frequency, and thus converted data 1-2 is obtained. The converted data 1-2 is stored between the header 3 and the body 4 of the storage area 9 based on the storage format 2.

The transformation matrix searching circuit 113 searches the transformation matrix A for the converted data 1-2, the entropy reducing circuit 114 generates the entropy-reduced data 6, and the data compression circuit 115 compresses the entropy-reduced data 6.

In the decompression processing circuit 120-2, the entropy increasing circuit 123 increases entropy of the decompressed data 8 obtained by the data decompression circuit 122, and thus entropy-increased data 1-2' is generated. The entropy-increased data 1-2' corresponds to the converted data 1-2.

In response to the acquisition of the entropy-increased data 1-2', the numerical-value-to-symbol conversion circuit 124 inversely converts numerical values of the entropy-increased data 1-2' in order from the head, into 1-byte symbols before conversion, based on the appearance frequency for each type of the 1-byte symbols, thereby restoring the original data 1.

The symbol-to-numerical-value conversion table 51 for mapping the 1-byte symbols of the original data 1 to integer multiples of $\frac{1}{2}^n$ of a cycle 256 will be described.

Figure 20:
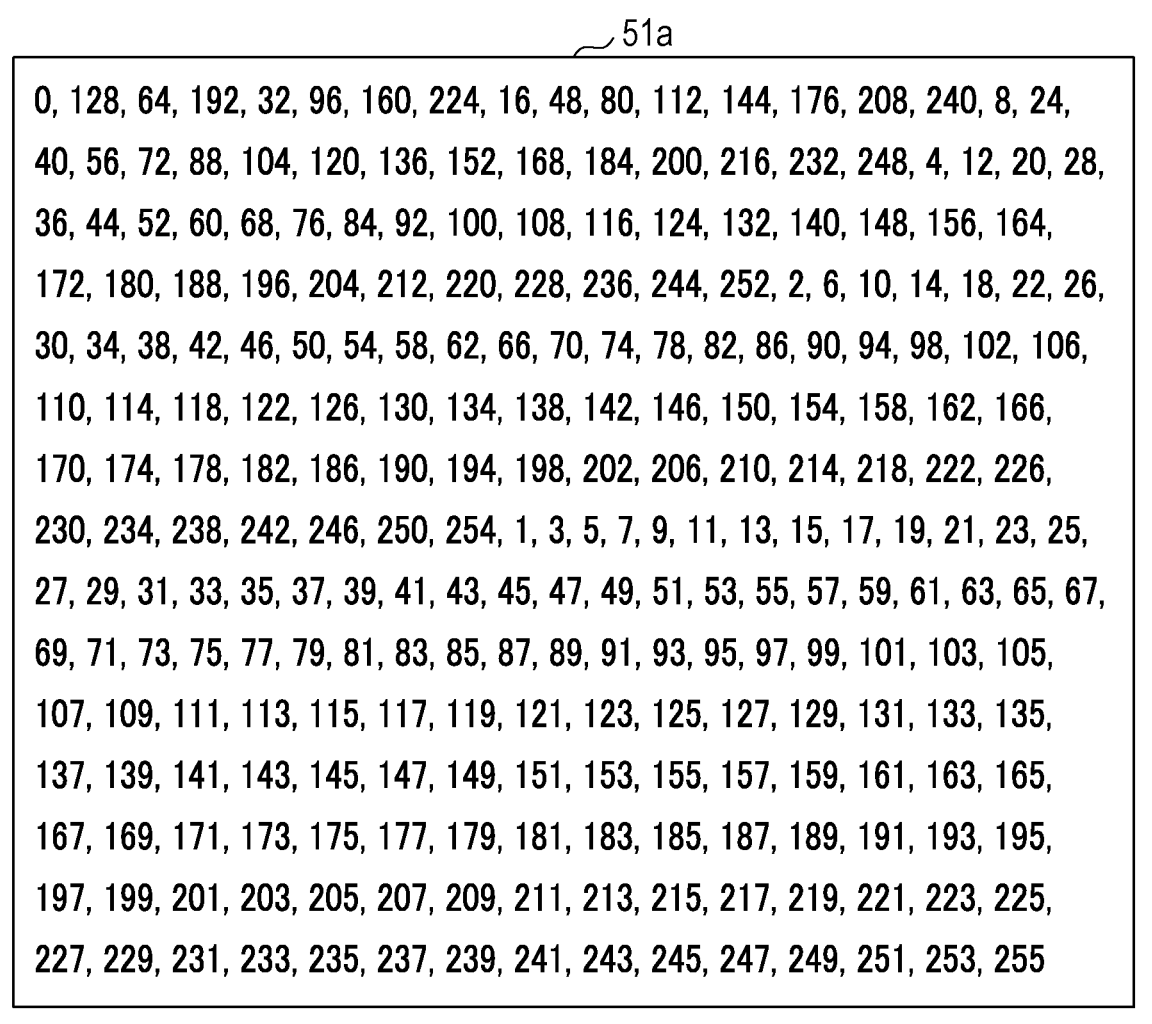

FIG. 20 is a diagram illustrating an example of a symbol-to-numerical-value conversion table. The symbol-to-numerical-value conversion table 51a illustrated in FIG. 20 is a table in which integer multiples of $\frac{1}{2}^n$ of a cycle 256 are simply listed in order starting from 0. A method of creating the symbol-to-numerical-value conversion table 51a will be described in detail with reference to a flowchart of FIG. 24.

In a case of using the symbol-to-numerical-value conversion table 51a, in the original data 1, the 1-byte symbol with the highest appearance frequency is converted to "0", the 1-byte symbol with the second highest appearance frequency is converted to "128", the 1-byte symbol with the third highest appearance frequency is converted to "64", the 1-byte symbol with the fourth highest appearance frequency is converted to "192", the 1-byte symbol with the fifth highest appearance frequency is converted to "32", the 1-byte symbol with the sixth highest appearance frequency is converted to "96", . . . , and the 1-byte symbol with the 256th highest appearance frequency is converted to "255".

The numerical values as mapping destinations will be described. The numerical values as mapping destinations are integer multiples of $\frac{1}{2}^n$ of a cycle 256, and as the appearance frequency is higher, the corresponding n is smaller.

Figure 21:
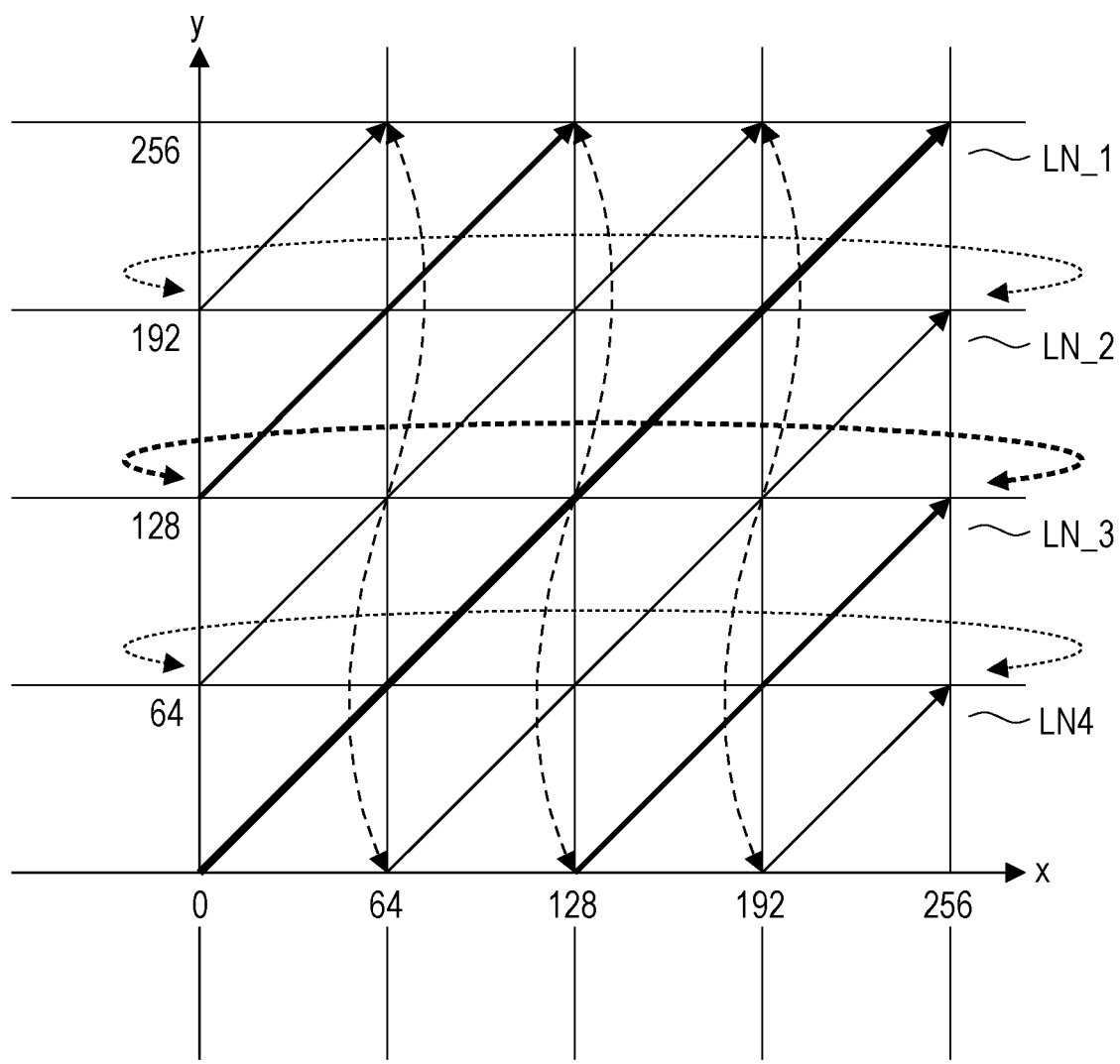
FIG. 21 is a diagram illustrating an example of a torus.

A fact that points of the integer multiples of $\frac{1}{2}^n$ of the cycle 256 have a very good property will be described. FIG. 21 is a diagram illustrating an example of a torus. FIG. 21 is a diagram illustrating closed straight lines with a slope of 1 in a two-dimensional torus.

Referring to FIG. 21, a straight line LN_1 is a straight line passing through a point (0, 0) and passing through a point (128, 128) and a point (192, 192). A straight line LN_2 is a straight line passing through a point (64, 0), a point (128, 64), a point (192, 128), and a point (0, 192). A straight line LN_3 is a straight line passing through a point (128, 0), a point (192, 64), a point (0, 128), and a point (64, 192). A straight Line LN_4 is a straight line passing through a point (192, 0), a point (0, 64), a point (64, 128), and a point (128, 192).

In a case where the matrix $T_1^{-1}$ as represented by Equation 43 is multiplied, points on these straight lines have the same first component value.

$$T_1^{-1} = \begin{pmatrix} 1 & -1 \\ 0 & 1 \end{pmatrix}$$ [Equation 43]

For example, a point on the straight line LN_2 has a first component of 64.

For example, in a case where there are only four types of symbols included in the original data 1, in the second embodiment, the symbols are mapped to "0", "128", "64", and "192" in descending order of the appearance frequencies of the symbols. In a case where the matrix $T_1^{-1}$ (Equation 43) is multiplied, numerical values different from these numerical values do not appear. Even when the matrix $T_1^m$ (Equation 41) is obtained by multiplying the matrix $T_1$ m times (m=0, 2, . . . , 255), numerical values other than the numerical values of the above four types do not appear as long as a remainder by 256 is taken.

As in this example, points of integer multiples of ½" of the cycle 256 have the following property: even in a case where the points are multiplied by a matrix, by taking a remainder by 256, numerical values other than these numerical values do not appear. The present inventors focus on the property, and improves the symbol-to-numerical-value conversion table 51a illustrated in FIG. 20. As a result, when obtaining the transformation matrix A, an increase in entropy is suppressed. Therefore, it is possible to easily obtain a matrix for entropy reduction.

Figure 22:
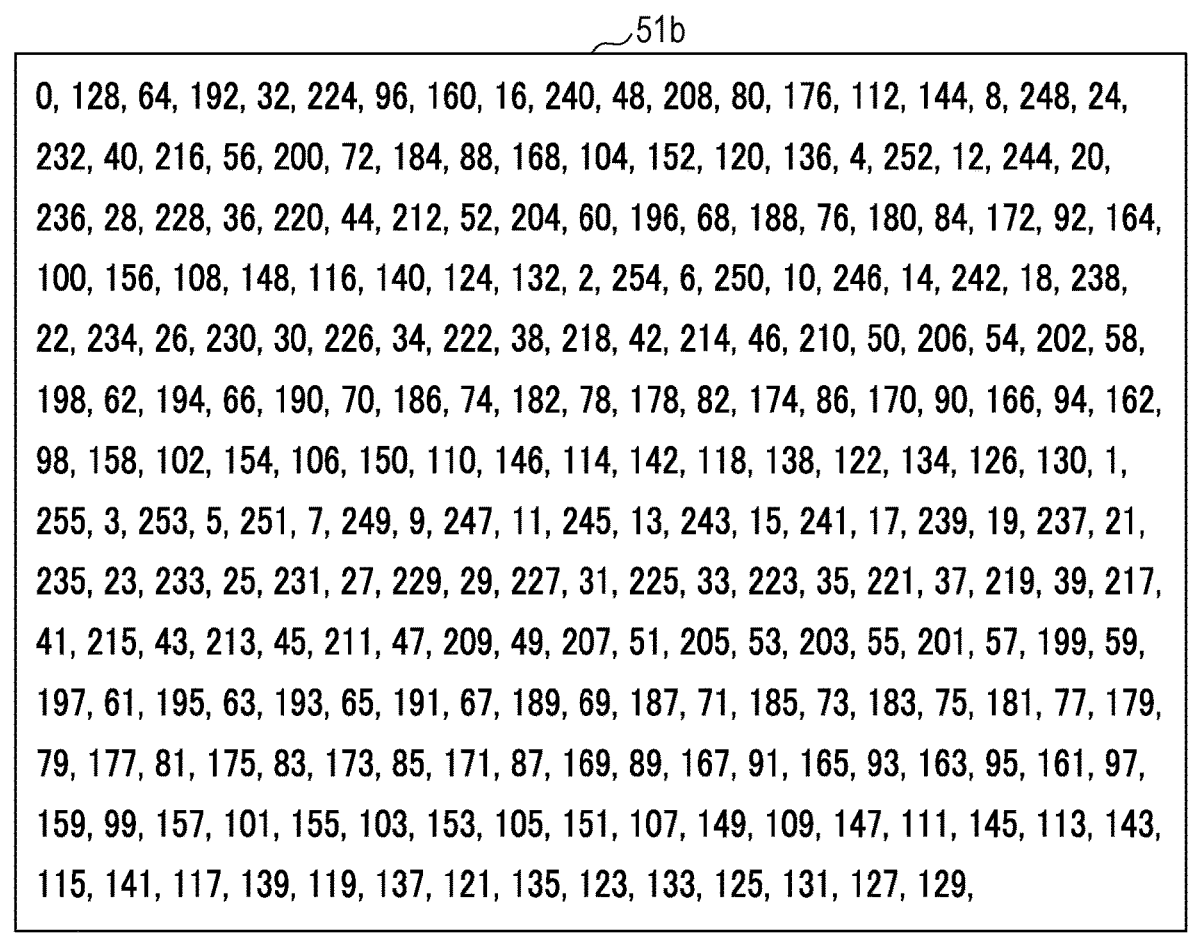

FIG. 22 is a diagram illustrating an improvement example of the symbol-to-numerical-value conversion table of FIG. 20. The symbol-to-numerical-value conversion table 51b illustrated in FIG. 22 is different in appearance order of integer multiples of ½" of the cycle 256, from the symbol-to-numerical-value conversion table 51a, which is obtained by simply listing integer multiples of ½" of the cycle 256 in order starting from 0.

In the symbol-to-numerical-value conversion table 51b, for example, "32" is assigned to a 1-byte symbol with the fifth highest appearance frequency, and "224" is assigned to a 1-byte symbol with the sixth highest appearance frequency. In the symbol-to-numerical-value conversion table 51a of FIG. 20, "32" is similarly assigned to a 1-byte symbol with the fifth highest appearance frequency, while "96" is assigned to a 1-byte symbol with the sixth highest appearance frequency.

The reason will be described. When considering the appearance frequency, a numerical value including "32" is expected to be (32, 0) or (0, 32) most frequently. Points on closed straight lines with a slope of 45 degrees from each of the points (32, 0) and (0, 32) are considered.

Figure 23:
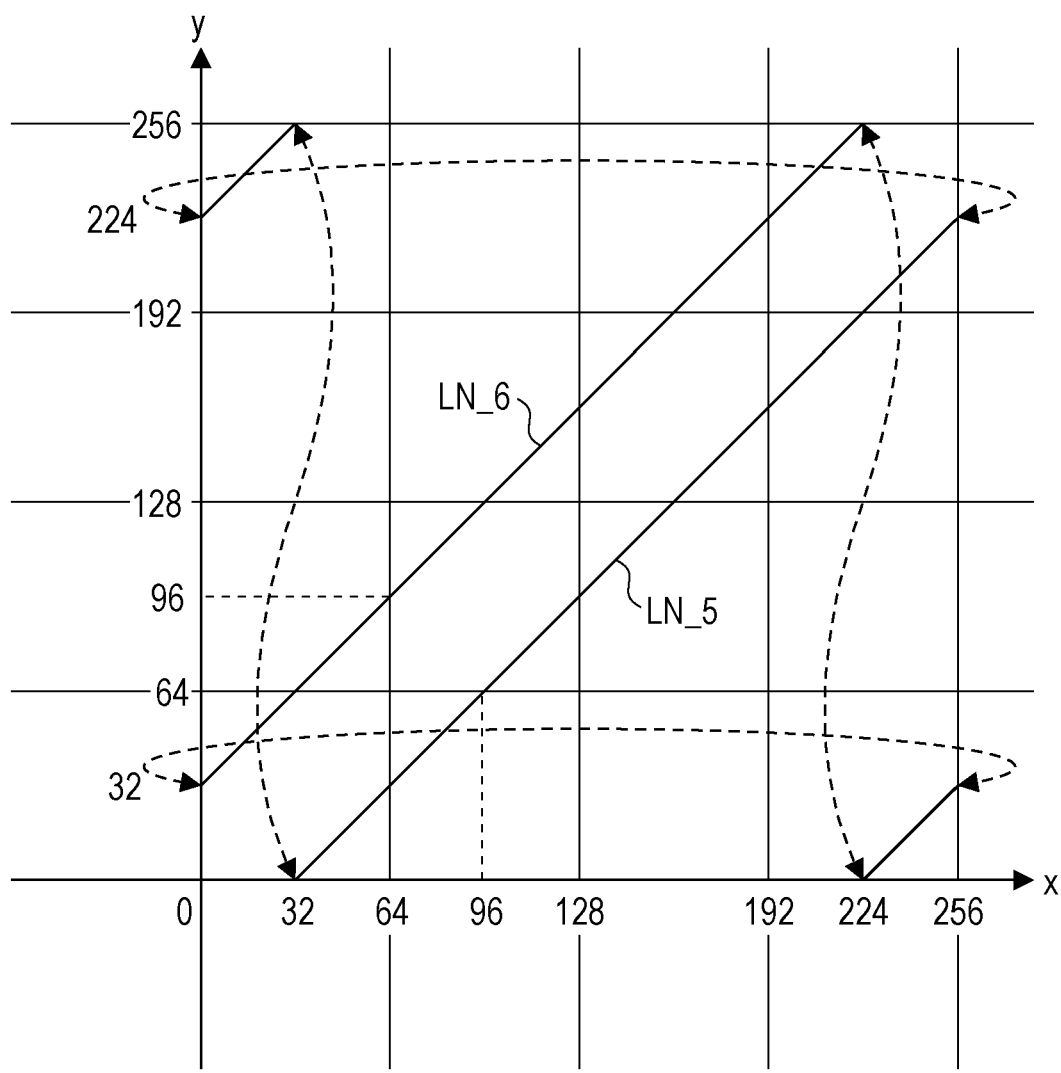
FIG. 23 is a diagram illustrating an example of a two-dimensional torus including "32"

FIG. 23 is a diagram illustrating an example of a two-dimensional torus including "32". In FIG. 23, in a cycle 256, a closed straight line LN_5 with a slope of 45 degrees from the point (32, 0) and a closed straight line LN_6 with a slope of 45 degrees from the point (0, 32) are illustrated.

In points on closed straight lines LN_5 and LN_6 with a slope of 45 degrees, points including "96" is a point (96, 64) on the closed straight line LN_5 and a point (64, 96) on the closed straight line LN_6, while points including "224" is a point (0, 224) on the closed straight line LN_6 and a point (224, 0) on the closed straight line LN_5.

A pair of "64" and "96" is a pair of symbols with the third highest appearance frequency and the sixth highest appearance frequency in the symbol-to-numerical-value conversion table 51a, and a pair of "0" and "224" is a pair of symbols with the first highest appearance frequency and the sixth highest appearance frequency in the symbol-to-numerical-value conversion table 51b. For this reason, the pair of "0" and "224" when referring to the symbol-to-numerical-value conversion table 51b is more likely to appear than the pair of "64" and "96" when referring to the symbol-to-numerical-value conversion table 51a.

Thus, the appearance frequency of the 1-byte symbol "32" when the matrix $T_1^{-1}$ (Equation 43) is multiplied and a closed straight line with a slope of 45 degrees is converted to a closed straight line extending vertically, is expected to be increased in the pair of "0" and "224". When "224" is set to be next to "32" with the fifth highest appearance frequency, entropy may be more efficiently reduced.

In the above example, although mapping destinations of the fifth and sixth 1-byte symbols are described, the same applies to mapping destinations of 17th and 18th 1-byte symbols. For example, while "24" is set to be next to "8" in the symbol-to-numerical-value conversion table 51a, as in the symbol-to-numerical-value conversion table 51b, "248" is set to be next to "8".

Thereby, the transformation matrix searching circuit 113 may easily find a matrix for entropy reduction. The symbol-to-numerical-value conversion table 51 created by the symbol-to-numerical-value conversion table creation circuit 109 is stored in the header 3 of the storage area 9 in which the converted data 1-2 is stored.

In the second embodiment, by using the symbol-to-numerical-value conversion table 51 found by the present inventors, the 1-byte symbols of the original data 1 are converted into numerical values based on the appearance frequencies of the 1-byte symbols. In the second embodiment, although 1-byte symbols are processed and the cycle is set to 256, X-byte symbols may be processed and a cycle may be set to $256^X$. In a case where 2-byte characters are processed, the cycle is set to 256×256.

Symbols with 7 bit shorter than 1 byte may be processed and the cycle may be set to $2^7$=128. In the following description, 1-byte symbols are processed and the cycle is set to 256. The second embodiment may be applied to symbols with certain bytes or certain bits.

The number of appearances of each of 1-byte symbols appearing in data is counted, and the 1-byte symbols are sorted in descending order of the number of appearances. As an example, in a case of using the symbol-to-numerical-value conversion table 51b of FIG. 22, in the original data 1, the 1-byte symbol with the highest appearance frequency is converted to "0", the 1-byte symbol with the second highest appearance frequency is converted to "128", the 1-byte symbol with the third highest appearance frequency is converted to "64", the 1-byte symbol with the fourth highest appearance frequency is converted to "192", the 1-byte symbol with the fifth highest appearance frequency is converted to "32", the 1-byte symbol with the sixth highest appearance frequency is converted to "224", . . . , and the 1-byte symbol with the 256th highest appearance frequency is converted to "129".

Therefore, in the converted data 1-2 with 256 bytes, converted numerical values of the same symbols are held at positions when the 1-byte symbols from the head of the original data 1 are regarded as integer values. For example, when 0x00, 0x01, 0x02, 0x03, . . . are mapped to 40, 128, 64, 192, . . . , the 256 bytes are represented by 40, 128, 64, 192, . . . , and in hexadecimal, becomes 0x28, 0x80, 0x40, 0xC0, . . . . The 256-byte information may be stored between the header 3 and the body 4 based on the storage format 2 described in the first embodiment. When inversely converting the numerical values into symbols, the original data 1 is restored based on the positions of the bytes from the head.

Next, creation processing of the symbol-to-numerical-value conversion table 51 by the symbol-to-numerical-value conversion table creation circuit 109 will be described. First, creation processing of the symbol-to-numerical-value conversion table 51a of FIG. 20 will be described.

Figure 24:
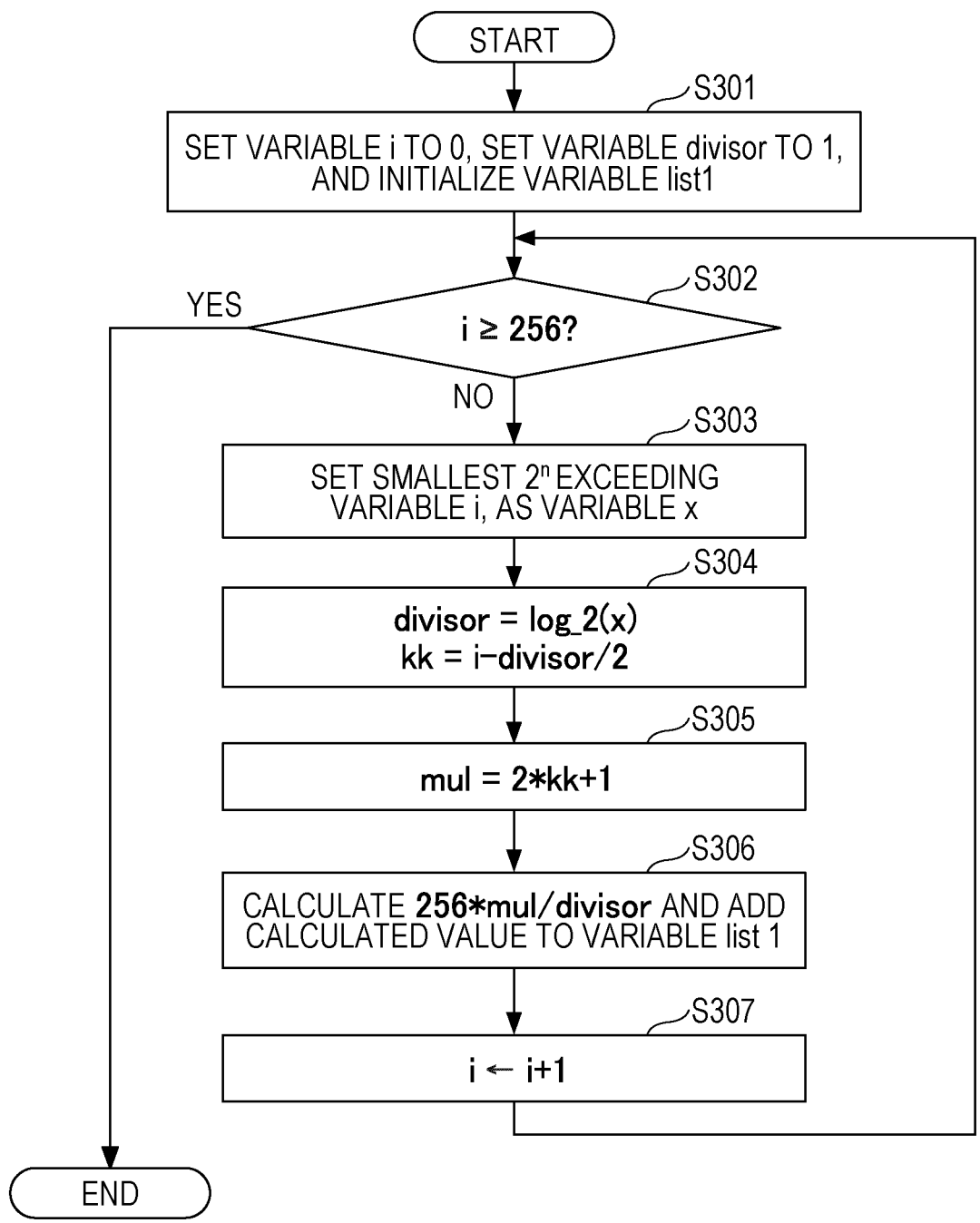
FIG. 24 is a flowchart for explaining creation processing of the symbol-to-numerical-value conversion table of FIG. 20.

FIG. 24 is a flowchart for explaining creation processing of the symbol-to-numerical-value conversion table of FIG. 20. In FIG. 24, the symbol-to-numerical-value conversion table creation circuit 109 may create the symbol-to-numerical-value conversion table 51a according to the data compression request 31, or may create the symbol-to-numerical-value conversion table 51a in advance.

The symbol-to-numerical-value conversion table creation circuit 109 sets a variable i to 0, sets a variable divisor to 1, and initializes a variable list1 (step S301). The variable i indicates the number of bytes from the head of the symbol-to-numerical-value conversion table 51a to the corresponding position. The variable divisor indicates a power n of 2 at the i-th byte position. The variable list1 indicates the symbol-to-numerical-value conversion table 51a.

Next, the symbol-to-numerical-value conversion table creation circuit 109 determines whether the variable i is equal to or larger than 256 (step S302). In a case where the variable i is smaller than 256 (NO in step S302), the symbol-to-numerical-value conversion table creation circuit 109 sets the smallest $2^n$ exceeding the variable i as a variable x (step S303), and calculates divisor=log_2(x) and kk=i-divisor/2 (step S304).

The symbol-to-numerical-value conversion table creation circuit 109 calculates mul=2*kk+1 (step S305).

Therefore, the symbol-to-numerical-value conversion table creation circuit 109 obtains a mapping destination with the i-th highest appearance frequency (a value of an integer multiple of $\frac{1}{2}^n$ of 256) by calculating 256*mul/divisor, adds the calculated value to the variable list1 (step S306), increments the variable i by 1 (step S307), returns to step S302, and repeats the same processing as described above.

In a case where the variable i is equal to or larger than 256 (YES in step S302), the symbol-to-numerical-value conversion table creation circuit 109 stores the symbol-to-numerical-value conversion table 51a in the header 1 of the storage area 9 based on the storage format 2, and then ends the symbol-to-numerical-value conversion table creation processing.

According to the flowchart of FIG. 24, in the symbol-to-numerical-value conversion table 51a of FIG. 20, the first mapping destination when i=0 is set to "0", the second mapping destination when i=1 is set to "128", the third mapping destination when i=2 is set to "64", the fourth mapping destination when i=3 is set to "192", the fifth mapping destination when i=4 is set to "32", the sixth mapping destination when i=5 is set to "96", . . . , and the 256th mapping destination when i=256 is set to "255".

Figure 25:
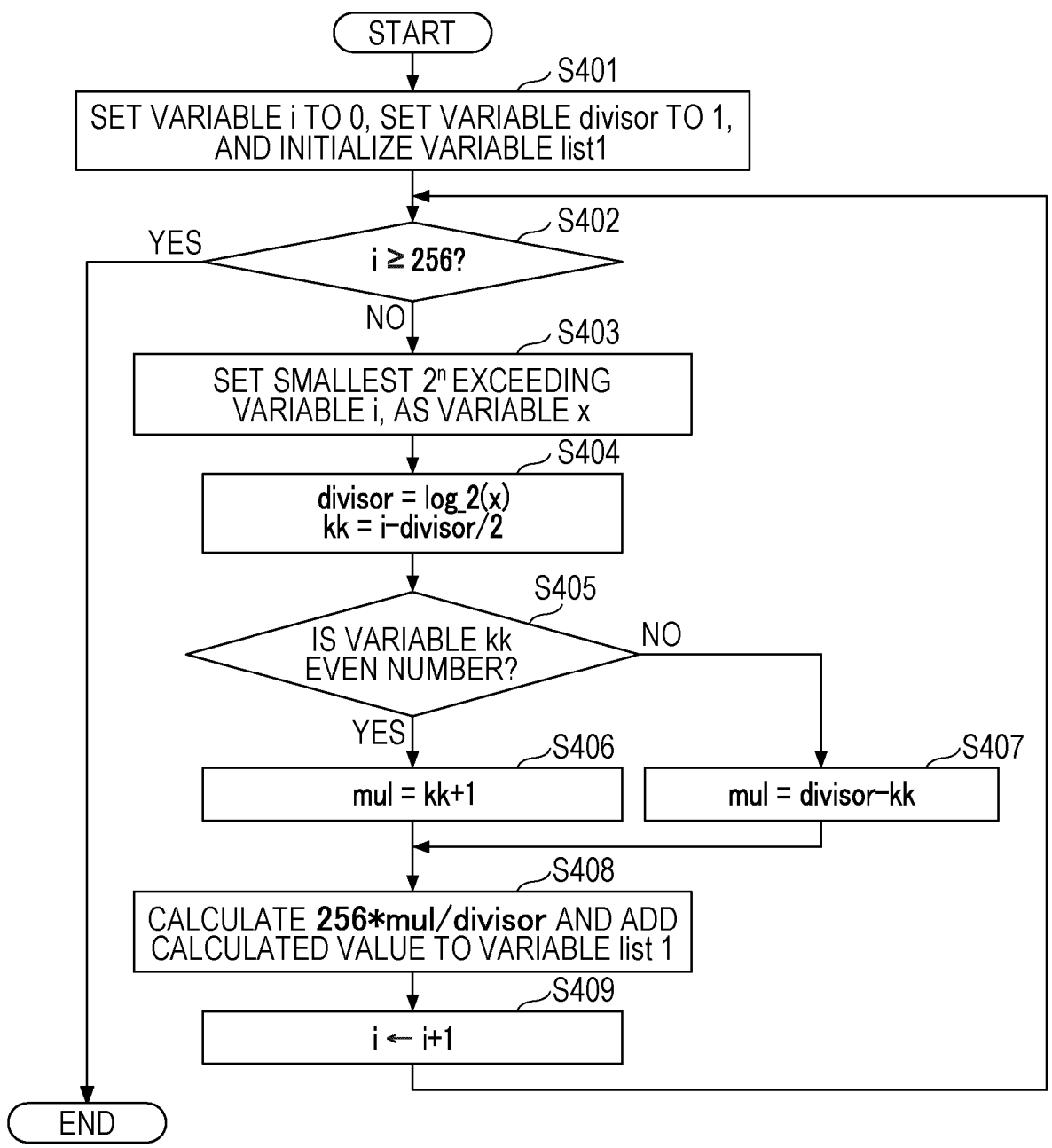
FIG. 25 is a flowchart for explaining creation processing of the symbol-to-numerical-value conversion table of FIG. 22.

FIG. 25 is a flowchart for explaining creation processing of the symbol-to-numerical-value conversion table of FIG. 22. In FIG. 25, the symbol-to-numerical-value conversion table creation circuit 109 may create the symbol-to-numerical-value conversion table 51b according to the data compression request 31, or may create the symbol-to-numerical-value conversion table 51b in advance.

The symbol-to-numerical-value conversion table creation circuit 109 sets a variable i to 0, sets a variable divisor to 1, and initializes a variable list2 (step S401). The variable i indicates the number of bytes from the head of the symbol-to-numerical-value conversion table 51b to the corresponding position. The variable divisor indicates a power n of 2 at the i-th byte position. The variable list2 indicates the symbol-to-numerical-value conversion table 51b.

Next, the symbol-to-numerical-value conversion table creation circuit 109 determines whether the variable i is equal to or larger than 256 (step S402). In a case where the variable i is smaller than 256 (NO in step S402), the symbol-to-numerical-value conversion table creation circuit 109 sets the smallest $2^n$ exceeding the variable i as a variable x (step S403), and calculates divisor=log_2(x) and kk=i-divisor/2 (step S404).

The symbol-to-numerical-value conversion table creation circuit 109 determines whether the variable kk is an even number (step S405). In a case where the variable kk is an even number (YES in step S405), the symbol-to-numerical-value conversion table creation circuit 109 sets a variable mul to a value obtained by adding 1 to a value of the variable kk (step S406), and proceeds to step S408.

On the other hand, in a case where the variable kk is an odd number (NO in step S405), the symbol-to-numerical-value conversion table creation circuit 109 sets a variable mul to a value obtained by subtracting the variable kk from the variable divisor (step S407), and proceeds to step S408.

The symbol-to-numerical-value conversion table creation circuit 109 obtains a mapping destination with the i-th highest appearance frequency (a value of an integer multiple of $\frac{1}{2}^n$ of 256) by calculating 256*mul/divisor, adds the calculated value to the variable list2 (step S409), increments the variable i by 1 (step S309), returns to step S402, and repeats the same processing as described above.

In a case where the variable i is equal to or larger than 256 (YES in step S402), the symbol-to-numerical-value conversion table creation circuit 109 stores the symbol-to-numerical-value conversion table 51b in the header 1 of the storage area 9 based on the storage format 2, and then ends the symbol-to-numerical-value conversion table creation processing.

According to the flowchart of FIG. 25, in the symbol-to-numerical-value conversion table 51b of FIG. 22, the first mapping destination when i=0 is set to "0", the second mapping destination when i=1 is set to "128", the third mapping destination when i=2 is set to "64", the fourth mapping destination when i=3 is set to "192", the fifth mapping destination when i=4 is set to "32", the sixth mapping destination when i=5 is set to "224", . . . , and the 256th mapping destination when i=256 is set to "129".

Figure 26:
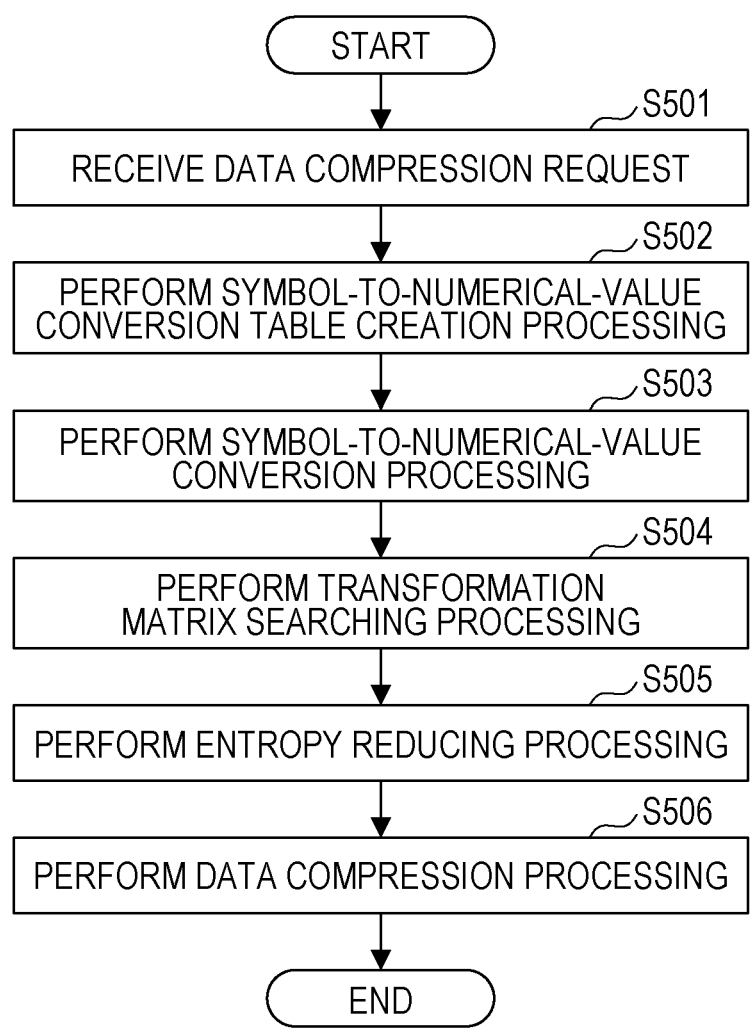
FIG. 26 is a flowchart for explaining an outline of compression processing according to the second embodiment.

Next, an outline of compression processing by the compression processing circuit 110-2 according to the second embodiment will be described. FIG. 26 is a flowchart for explaining an outline of compression processing according to the second embodiment. In FIG. 26, when a user inputs a data compression request 31 to the information processing apparatus 100, the compression request receiving circuit 111 of the compression processing circuit 110-2 receives the data compression request 31 (step S501). The compression request receiving circuit 111 notifies the symbol-to-numerical-value conversion table creation circuit 109 of the compression request of the original data 1.

In response to the compression request from the compression request receiving circuit 111, the symbol-to-numerical-value conversion table creation circuit 109 performs symbol-to-numerical-value conversion table creation processing (step S502). The symbol-to-numerical-value conversion table creation processing may be performed according to the flowchart of FIG. 24 or FIG. 25.

In a case where the symbol-to-numerical-value conversion table 51 already exists in the storage area 9 of the memory 130, the symbol-to-numerical-value conversion table creation processing may be omitted. Thereafter, the symbol-to-numerical-value conversion table creation circuit 109 notifies the symbol-to-numerical-value conversion circuit 112 of the compression request of the original data 1.

The symbol-to-numerical-value conversion table creation circuit 109 acquires the symbol-to-numerical-value conversion table 51 from the header 3 of the storage area 9, and performs symbol-to-numerical-value conversion processing of converting the 1-byte symbols of the original data 1 (step S503). The converted data 1-2 is stored between the header 3 and the body 4 of the storage area 9. The symbol-to-numerical-value conversion table creation circuit 109 notifies the transformation matrix searching circuit 113 of the compression request of the original data 1.

In response to the notification of the compression request from the symbol-to-numerical-value conversion table creation circuit 109, the transformation matrix searching circuit 113 performs transformation matrix searching processing of obtaining an optimum transformation matrix A (Equation 37) which reduces an amount of data when data compression processing of the converted data 1-2 is performed (step S504). By setting $d_1 d_2 d_3 \ldots$ for each 1-byte symbol from the head of the converted data 1-2, the converted data is regarded as a byte string (a). Thus, the same transformation matrix searching processing as in the first embodiment may be performed, and the transformation matrix A may be acquired more efficiently compared to the first embodiment.

When the transformation matrix A is obtained, the entropy reducing circuit 114 performs entropy reducing processing of reducing entropy of the converted data 1-2 by using the transformation matrix A (step S505).

When the entropy-reduced data 6 is obtained, the data compression circuit 115 performs data compression processing of the entropy-reduced data 6 (step S506). The compressed data 7 is stored in the body 4 of the storage area 9.

In step S502 of FIG. 26, the symbol-to-numerical-value conversion table 51$a$ or the symbol-to-numerical-value conversion table 51$b$ (simply referred to as a symbol-to-numerical-value conversion table 51) is created according to the flowchart of FIG. 24 or FIG. 25.

Figure 27:
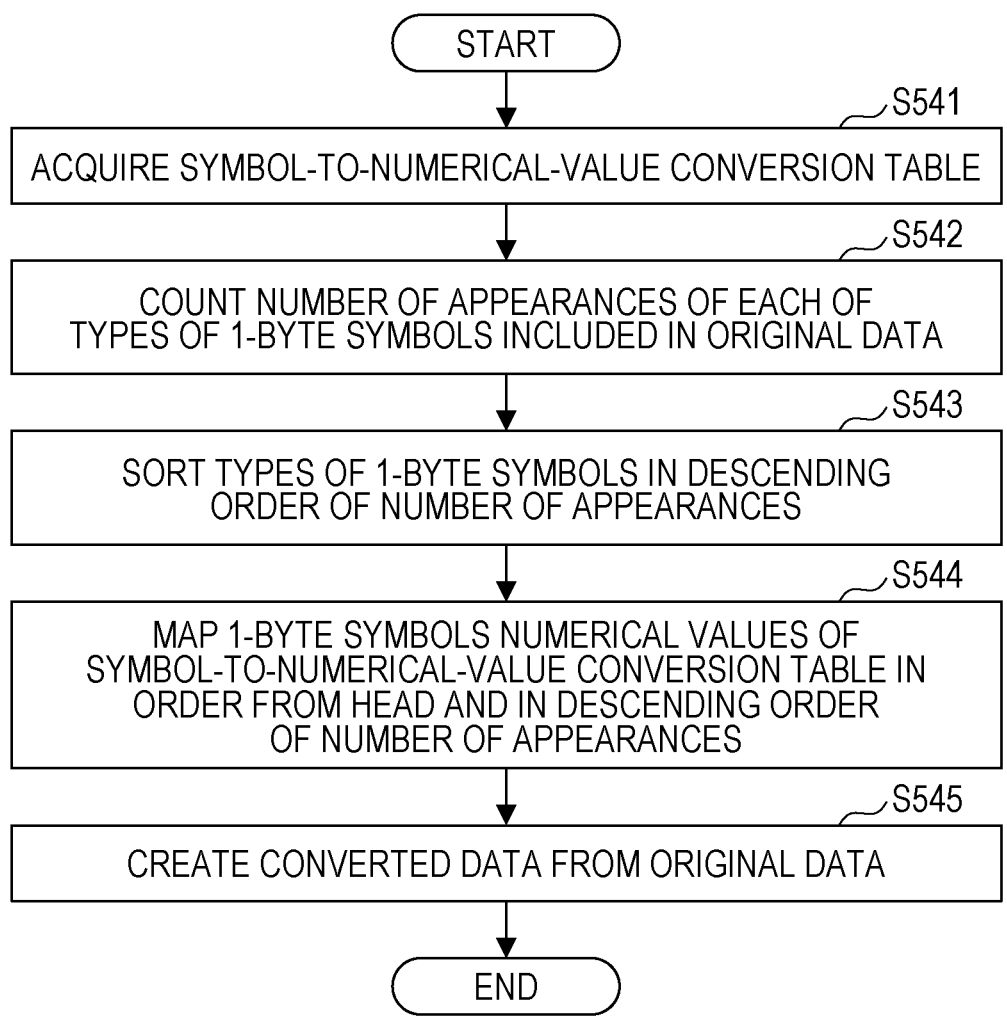
FIG. 27 is a flowchart for explaining symbol-to-numerical-value conversion processing according to the second embodiment.

The symbol-to-numerical-value conversion processing using the created symbol-to-numerical-value conversion table 51 by the symbol-to-numerical-value conversion circuit 112 will be described. FIG. 27 is a flowchart for explaining symbol-to-numerical-value conversion processing according to the second embodiment.

In FIG. 27, the symbol-to-numerical-value conversion circuit 112 acquires the symbol-to-numerical-value conversion table 51 from the storage area 9 (step S541). The symbol-to-numerical-value conversion circuit 112 counts the number of appearances of each of types of 1-byte symbols included in the original data 1 (step S542), and sorts the types of the 1-byte symbols in descending order of the number of appearances (step S543).

The symbol-to-numerical-value conversion circuit 112 maps the 1-byte symbols to numerical values of the symbol-to-numerical-value conversion table 51 in order from the head and in descending order of the number of appearances (step S544).

The symbol-to-numerical-value conversion circuit 112 creates converted data 1-2 from the original data 1 by using the numerical values converted according to the appearance frequencies (step S545). The converted numerical values of the same symbols are associated with positions when the 1-byte symbols are regarded as integer values from the head of 256 bytes, and are stored between the header 3 and the body 4 of the storage area 9.

The transformation matrix searching circuit 113 finds a transformation matrix A for the converted data 1-2 which is converted by the symbol-to-numerical-value conversion table 51. The transformation matrix searching processing by the transformation matrix searching circuit 113 is performed according to the flowchart of FIG. 15 by replacing the original data 1 with the converted data 1-2 as target data for entropy reduction. The transformation matrix A for the converted data 1-2 is acquired. The header information 5 including an exponent string $\alpha_1, \alpha_2, \ldots, \alpha_m$, an exponent string length, and the like is stored in the header 3 of the storage area 9, the exponent string $\alpha_1, \alpha_2, \ldots, \alpha_m$ indicating the number of times of squaring each time the matrix $T_1$ and the matrix $T_2$ representing the transformation matrix A are alternately multiplied.

The entropy reducing circuit 114 obtains the entropy-reduced data 6 by generating the transformation matrix A based on the exponent strings $\alpha_1, \alpha_2, \ldots, \alpha_m$, multiplying a matrix representing the converted data 1-2 by the transformation matrix A, and taking a remainder of each component of a matrix obtained by the multiplication by 256. The obtained entropy-reduced data 6 is stored in the body 4 of the storage area 9.

Thereafter, the entropy-reduced data 6 is compressed by the data compression circuit 115, and the compressed data 7 is overwritten and stored in the body 4 of the storage area 9. The entropy-reduced data 6 is removed. A data file including the compressed data 7 is formed in the storage area 9.

Even when the symbols of the original data 1 are converted into numerical values by using the symbol-to-numerical-value conversion table 51$a$ or the symbol-to-numerical-value conversion table 51$b$ and the converted numerical values are multiplied by a matrix of which the determinant is 1, numerical values different from the converted values do not appear. This is as follows.

When multiplying a numerical value of $(256 \times k/2^n)$ by an integer coefficient matrix A, Equation 44 is obtained.

$$A \cdot \left(256 \times \frac{k}{2^n}\right) \qquad \text{[Equation 44]}$$

k may take any value from 0 to $2^n - 1$. When representing k as a matrix $(0, \ldots, 2^n - 1)$, Equation 44 is rewritten as Equation 45.

$$\frac{256}{2^n}(0, \cdots, 2^n - 1) \qquad \text{[Equation 45]}$$

On the other hand, since the matrix A is an integer coefficient matrix, when the matrix A is multiplied based on Equation 45, components are integer-multiplied and the integer-multiplied components are added up. When taking a remainder of each component of the matrix represented by Equation 45, by 256, Equation 46 is represented as follows.

$$\frac{256}{2^n}(a_1 k_1 + a_2 k_2 + \cdots + a_N k_N) \% 256 \quad \text{[Equation 46]}$$
$$a_1, \cdots, a_N \in Z,$$
$$k_1, \cdots, k_N \in (0, \cdots, 2^n - 1)$$

In Equation 46, components represented by Equation 47 are likely to be an improper fraction.

$$\frac{1}{2^n}(a_1 k_1 + a_2 k_2 + \cdots + a_N k_N) \quad \text{[Equation 47]}$$

When the components are decomposed into an integer C and a numerator D, Equation 46 is represented by Equation 48.

$$256 \times \left(C + \frac{D}{2^n}\right) \% 256 \quad \text{[Equation 48]}$$

In Equation 48, the integer C may be removed by multiplying 256 and taking a remainder by 256. Thus, Equation 48 is represented by Equation 49.

$$256 \times \left(C + \frac{D}{2^n}\right) \% 256 \quad \text{[Equation 49]}$$

A result value obtained by Equation 49 is included in a set of values, which may be obtained by Equation 45, and a value different from the value converted after multiplication by the matrix A does not appear.

Figure 28:
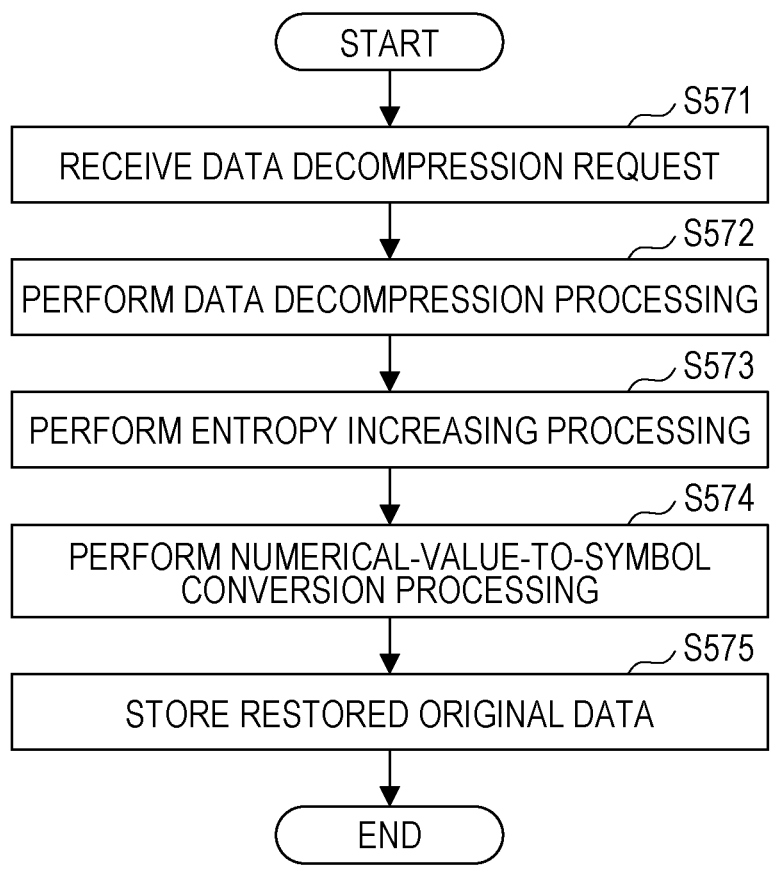
FIG. 28 is a flowchart for explaining an outline of decompression processing according to the second embodiment.

Next, decompression processing by the decompression processing circuit 120-2 according to the second embodiment will be described. FIG. 28 is a flowchart for explaining an outline of decompression processing according to the second embodiment.

In FIG. 28, when a user inputs a data decompression request 32 to the information processing apparatus 100, the decompression request receiving circuit 121 receives the data decompression request 32 (step S571). The data decompression circuit 122 is notified of decompression request of the compressed data 7. A data file with the compressed data 7 is stored in the memory 130. The data file stored in the memory 130 corresponds to the storage area 9.

The data decompression circuit 122 obtains decompressed data 8 by reading the compressed data 7 from the storage area 9 and decompressing the compressed data 7 (step S572). Thereafter, the entropy increasing circuit 123 performs entropy increasing processing (step S573). The entropy increasing circuit 123 generates entropy-increased data 1-2' by increasing entropy of the decompressed data 8 according to the flowchart of FIG. 18. The entropy-increased data 1-2' corresponds to the converted data 1-2 when performing compression, and is stored in the body 4 of the storage area 9.

When the entropy-increased data 1-2' is obtained, numerical-value-to-symbol conversion processing by the numerical-value-to-symbol conversion circuit 124 according to the second embodiment is performed (step S574). The original data 1 is restored by the numerical-value-to-symbol conversion processing. The numerical-value-to-symbol conversion circuit 124 stores the restored original data 1 in the memory 130 (step S575). The decompression processing by the decompression processing circuit 120-2 is ended.

Figure 29:
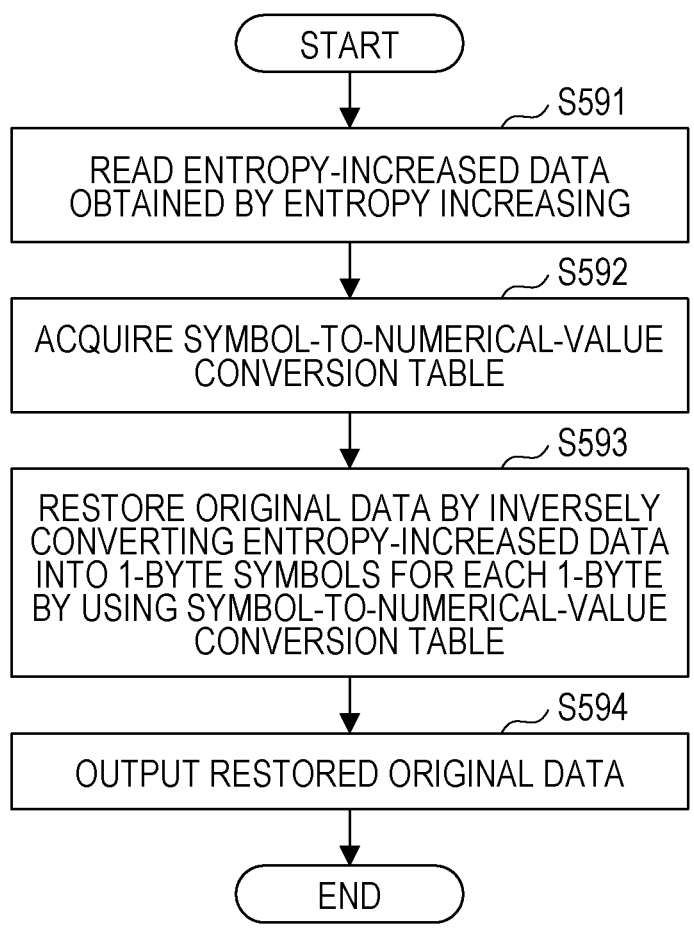
FIG. 29 is a flowchart for explaining numerical-value-to-symbol conversion processing according to the second embodiment.

FIG. 29 is a flowchart for explaining numerical-value-to-symbol conversion processing according to the second embodiment. In FIG. 29, the numerical-value-to-symbol conversion circuit 124 reads the entropy-increased data 1-2' obtained by increasing entropy of the decompressed data by the entropy increasing circuit 123, from the storage area 9 of the memory 130 (step S591). The numerical-value-to-symbol conversion circuit 124 acquires the symbol-to-numerical-value conversion table 51 from the header 3 of the storage area 9 (step S592).

The numerical-value-to-symbol conversion circuit 124 restores the original data 1 by inversely converting the entropy-increased data 1-2' into 1-byte symbols in order for each 1-byte by using the symbol-to-numerical-value conversion table 51 (step S593), and outputs the restored original data 1 to the memory 130 (step S594).

As described above, in the second embodiment, before the entropy reducing processing according to the first embodiment is performed, in order to efficiently reduce entropy, by converting 1-byte strings of the original data 1 into numerical values according to appearance frequencies, entropy may be reduced more reliably.

The embodiments disclosed herein are not limited to the specifically-disclosed embodiments, and various modifications and changes may be made without departing from the scope of the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing apparatus comprising:
   a memory; and
   a processor coupled to the memory and configured to:
   receive a compression request which designates data represented by a plurality of integers,
   represent the data designated by the compression request as a data matrix,
   obtain a transformation matrix of which determinant is 1, and which is represented by a product of a first matrix and a second matrix, with a product of the first matrix and the second matrix representing a certain integer coefficient matrix, by searching a power by which entropy becomes lowest using at least one of the first matrix and the second matrix,
   reduce entropy by multiplying the data matrix by the transformation matrix, to thereby provide entropy reduced data,
   storing the transformation matrix in a header of a file, and
   storing the entropy reduced data in a body of the file.

2. The information processing apparatus according to claim 1,
   wherein, to reduce the entropy, the processor is configured to take a remainder of a value of each component, of a matrix obtained by the multiplying of the data matrix by the transformation matrix, by a predetermined numerical value, to thereby provide the entropy reduced data.

3. The information processing apparatus according to claim 1,
wherein, in the multiplying of the data matrix by the transformation matrix, the processor is configured to:
alternately multiply the first matrix and the second matrix, and
obtain the power by which the entropy becomes lowest each time the first matrix and the second matrix are multiplied.

4. The information processing apparatus according to claim 2,
wherein the predetermined numerical value is 256.

5. The information processing apparatus according to claim 2,
wherein the stored entropy reduced data is compressed data, and the processor is configured to restore the data matrix by
representing decompressed data obtained by decompressing the compressed data stored in the body of the file, as a matrix, and
increasing the entropy by multiplying the matrix representing the decompressed data by an inverse transformation matrix obtained by using the transformation matrix stored in the header of the file and the predetermined numerical value and taking a remainder of a value of each component, of a matrix obtained by the multiplying of the matrix representing the decompressed data by the inverse transformation matrix, by the predetermined numerical value.

6. The information processing apparatus according to claim 2,
wherein the processor is configured to:
create a table indicating values of integer multiples of ½" of the predetermined numerical value, and
convert values of each integer of the plurality of integers of the data into numerical values as mapping destinations, which are obtained in order from a head of the table, in descending order of appearance frequencies, to thereby provide converted data, and
wherein the data matrix represents the converted data.

7. The information processing apparatus according to claim 6,
wherein, in a two-dimensional torus in which the predetermined numerical value for taking the remainder is set as a cycle, when a closed straight line with a slope of 45 degrees is converted to a closed straight line extending vertically, the processor selects a point on the closed straight line with a slope of 45 degrees, the point being a point at which an appearance frequency of a predetermined type of the plurality of integers is expected to be increased.

8. The information processing apparatus according to claim 1,
wherein, after the data matrix is multiplied by the transformation matrix, appearance frequencies of types of appearing integers in the data matrix are biased.

9. An information processing method executed by a processor included in an information processing apparatus, the method comprising:
receiving a compression request which designates data represented by a plurality of integers,
representing the data designated by the compression request as a data matrix,
obtaining a transformation matrix of which determinant is 1, and which is represented by a product of a first matrix and a second matrix, with a product of the first matrix and the second matrix representing a certain integer coefficient matrix, by searching a power by which entropy becomes lowest using at least one of the first matrix and the second matrix,
reducing entropy by multiplying the data matrix by the transformation matrix, to thereby provide entropy reduced data,
storing the transformation matrix in a header of a file, and
storing the entropy reduced data in a body of the file.

10. A non-transitory computer-readable recording medium storing a program that causes a processor included in an information processing apparatus to execute a process, the process comprising:
receiving a compression request which designates data represented by a plurality of integers,
representing the data designated by the compression request as a data matrix,
obtaining a transformation matrix of which determinant is 1, and which is represented by a product of a first matrix and a second matrix, with a product of the first matrix and the second matrix representing a certain integer coefficient matrix, by searching a power by which entropy becomes lowest using at least one of the first matrix and the second matrix,
reducing entropy by multiplying the data matrix by the transformation matrix, to thereby provide entropy reduced data,
storing the transformation matrix in a header of a file, and
storing the entropy reduced data in a body of the file.

* * * * *